United States Patent
Akashi et al.

(10) Patent No.: US 12,069,946 B2
(45) Date of Patent: Aug. 20, 2024

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventors: Nobutaka Akashi, Yokohama (JP); Hirokazu Kuwabara, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 721 days.

(21) Appl. No.: 17/186,629

(22) Filed: Feb. 26, 2021

(65) Prior Publication Data
US 2021/0376249 A1    Dec. 2, 2021

(30) Foreign Application Priority Data
May 28, 2020  (KR) ......................... 10-2020-0064095

(51) Int. Cl.
| | |
|---|---|
| H10K 85/40 | (2023.01) |
| C07F 5/02 | (2006.01) |
| H10K 50/12 | (2023.01) |
| H10K 50/15 | (2023.01) |
| H10K 50/16 | (2023.01) |
| H10K 50/805 | (2023.01) |
| H10K 85/60 | (2023.01) |

(52) U.S. Cl.
CPC ........... *H10K 85/656* (2023.02); *C07F 5/027* (2013.01); *H10K 50/12* (2023.02); *H10K 85/40* (2023.02); *H10K 85/636* (2023.02); *H10K 85/657* (2023.02); *H10K 85/6572* (2023.02); *H10K 85/6574* (2023.02); *H10K 85/6576* (2023.02); *H10K 50/15* (2023.02); *H10K 50/16* (2023.02); *H10K 50/805* (2023.02)

(58) Field of Classification Search
CPC ............................... C07F 5/027; C07B 59/004
See application file for complete search history.

(56) References Cited

U.S. PATENT DOCUMENTS

| | | |
|---|---|---|
| 10,374,166 B2 | 8/2019 | Hatakeyama et al. |
| 2016/0260631 A1 | 9/2016 | Mollmann et al. |
| 2018/0301629 A1 | 10/2018 | Hatakeyama et al. |
| 2019/0181350 A1 | 6/2019 | Hatakeyama et al. |
| 2019/0207112 A1 | 7/2019 | Hatakeyama et al. |
| 2019/0256538 A1 | 8/2019 | Hatakeyama et al. |
| 2020/0058885 A1 | 2/2020 | Hong et al. |
| 2020/0185626 A1 | 6/2020 | Yuuki |
| 2020/0223873 A1 | 7/2020 | Thobes et al. |
| 2021/0273174 A1* | 9/2021 | Kuwabara ............ H10K 85/322 |
| 2022/0223790 A1* | 7/2022 | Suzaki .................. C09K 11/06 |

FOREIGN PATENT DOCUMENTS

| | | |
|---|---|---|
| CA | 3 017 010 A1 | 3/2019 |
| CN | 107266484 A | 10/2017 |
| CN | 107417715 A | 12/2017 |
| CN | 107501311 A | 12/2017 |
| JP | 5935199 B2 | 6/2016 |
| JP | 2019-156822 A | 9/2019 |
| KR | 10-1955648 B1 | 3/2019 |
| KR | 10-2019-0069295 A | 6/2019 |
| KR | 10-2020-0071192 A | 6/2020 |
| WO | WO 2010/050778 A1 | 5/2010 |
| WO | WO 2015/102118 A1 | 7/2015 |
| WO | WO 2016/152544 A1 | 9/2016 |
| WO | WO 2017/188111 A1 | 11/2017 |
| WO | WO 2018/047639 A1 | 3/2018 |
| WO | WO 2018/203666 A1 | 11/2018 |
| WO | WO 2019/052939 A1 | 3/2019 |

OTHER PUBLICATIONS

U.S. Appl. No. 17/459,393, filed Aug. 27, 2021.*
Kohei Matsui et al., "One-Shot Multiple Borylation toward BN-Doped Nanographenes", Journal of the American Chemical Society, Nov. 9, 2017, p. 1195-1198, 2018, vol. 140, American Chemical Society.

* cited by examiner

*Primary Examiner* — Rosalynd A Keys
(74) *Attorney, Agent, or Firm* — Lewis Roca Rothgerber Christie LLP

(57) ABSTRACT

An organic electroluminescence device of one or more embodiments includes a first electrode, a hole transport region disposed on the first electrode, an emission layer disposed on the hole transport region, an electron transport region disposed on the emission layer and a second electrode disposed on the electron transport region, wherein the emission layer includes a polycyclic compound represented by Formula 1, thereby showing high emission efficiency:

Formula 1

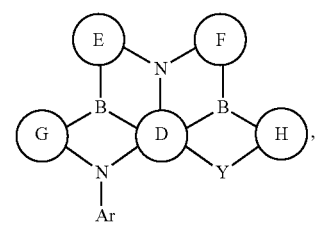

wherein Y is O or S.

20 Claims, 2 Drawing Sheets

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2020-0064095, filed on May 28, 2020, the entire content of which is hereby incorporated by reference.

BACKGROUND

1. Field

One or more aspects of embodiments of the present disclosure herein relate to an organic electroluminescence device and a polycyclic compound for an organic electroluminescence device.

2. Description of the Related Art

Recently, the development of an organic electroluminescence display as an image display is being actively conducted. Different from a liquid crystal display, the organic electroluminescence display is a self-luminescent display, in which holes and electrons injected from a first electrode and a second electrode recombine in an emission layer, and a light-emitting material including an organic compound in the emission layer emits light to attain display of images.

In the application of an organic electroluminescence device to a display, the decrease of the driving voltage, and the increase of the emission efficiency and the life of the organic electroluminescence device are required (or desired), and developments of materials for an organic electroluminescence device capable of stably attaining these characteristics are being continuously required (or desired).

Particularly, recently, in order to accomplish an organic electroluminescence device with high efficiency, techniques on phosphorescence emission, which uses energy in a triplet state, or delayed fluorescence emission, which uses the generating phenomenon of singlet excitons by the collision of triplet excitons (triplet-triplet annihilation, TTA), are being developed, and development of a material for thermally activated delayed fluorescence (TADF) using delayed fluorescence phenomenon is also being conducted.

SUMMARY

One or more aspects of embodiments of the present disclosure are directed toward an organic electroluminescence device having long life and high efficiency, and a polycyclic compound used therein.

One or more aspects of embodiments of the present disclosure also provide for an organic electroluminescence device including a thermally activated delayed fluorescence emitting material and a polycyclic compound used as a thermally activated delayed fluorescence material.

In one or more embodiments, there is provided a polycyclic compound represented by the following Formula 1:

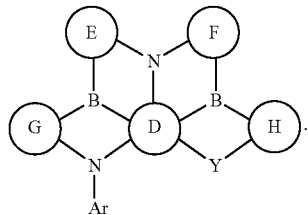

Formula 1 in Formula 1, Y may be O, or S; ring D to ring H may each independently be a substituted or unsubstituted aryl ring of 6 to 30 carbon atoms for forming a ring, or a substituted or unsubstituted heteroaryl ring of 2 to 30 carbon atoms for forming a ring, and/or ring E and ring F, ring F and ring H, ring G and ring E, ring G and Ar, and ring D and Ar may each independently be combined with each other to form a ring; and Ar may be a substituted or unsubstituted aryl group of 6 to 30 carbon atoms for forming a ring or a substituted or unsubstituted heteroaryl group of 2 to 30 carbon atoms for forming a ring.

In one or more embodiments, Ar may be represented by the following Formula 2:

Formula 2

In Formula 2, Ra may be a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or may be combined with an adjacent group to form a ring; and "b" may be an integer of 0 to 5.

In one or more embodiments, Formula 1 may be represented by the following Formula 3:

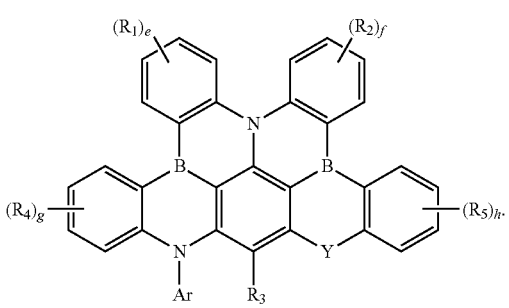

Formula 3

In Formula 3, $R_1$ to $R_5$ may each independently be a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or may be combined with an adjacent group to form a ring; "e" to "h" may each independently be an integer of 0 to 4; and Y and Ar are the same as defined in Formula 1.

In one or more embodiments, $R_1$ to $R_5$ may each independently be a hydrogen atom, a deuterium atom, a substituted or unsubstituted arylamine group, a substituted or unsubstituted phenyl group, a substituted or unsubstituted carbazole group, a substituted or unsubstituted dibenzofuran group, or a substituted or unsubstituted dibenzothiophene group.

In one or more embodiments, at least one of $R_1$ to $R_5$ may include a substituted or unsubstituted amine group or a substituted or unsubstituted N-containing heteroaryl group.

In one or more embodiments, Formula 3 may be represented by the following Formula 4-1 or Formula 4-2:

Formula 4-1

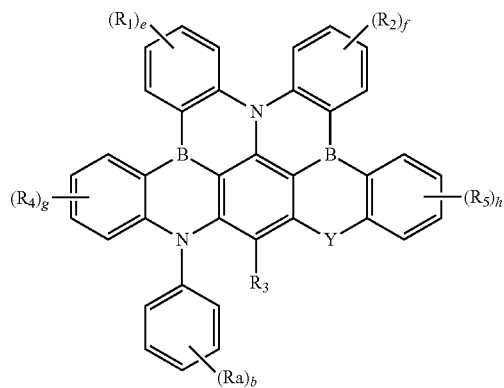

Formula 4-2

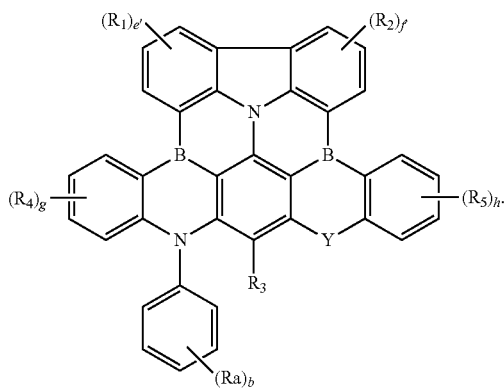

In Formula 4-1 and Formula 4-2, Ra may be a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or may be combined with an adjacent group to form a ring; "b" may be an integer of 0 to 5; "e" and "f" may each independently be an integer of 0 to 3; and Y, $R_1$ to $R_5$, and "e" to "h" are the same as defined in Formula 3.

In one or more embodiments, Formula 4-1 may be represented by the following Formula 5-1 or Formula 5-2:

Formula 5-1

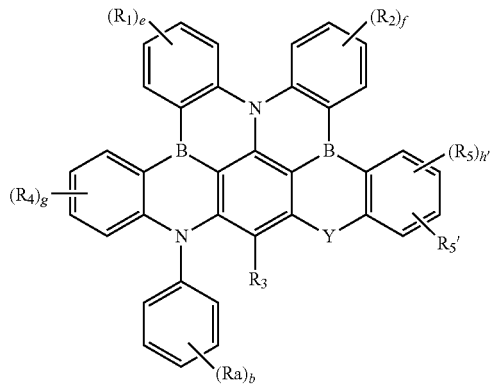

Formula 5-2

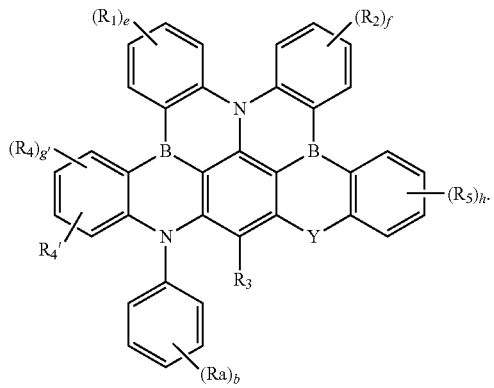

in Formula 5-1 and Formula 5-2, $R_4'$ and $R_5'$ may each independently be a hydrogen atom, a deuterium atom, a substituted or unsubstituted arylamine group, a substituted or unsubstituted phenyl group, a substituted or unsubstituted carbazole group, a substituted or unsubstituted dibenzofuran group, or a substituted or unsubstituted dibenzothiophene group, "g'" and "h'" may each independently be an integer of 0 to 3; and Y, $R_1$ to $R_5$, Ra, "b" and "e" to "h" are the same as defined in Formula 4-1.

In one or more embodiments, the compound represented by Formula 1 may be at least one among compounds represented in Compound Group 1.

In one or more embodiments of the present disclosure, there is provided an organic electroluminescence device including a first electrode; a hole transport region disposed (e.g., provided) on the first electrode; an emission layer disposed on the hole transport region; an electron transport region disposed on the emission layer; and a second electrode disposed on the electron transport region, wherein the first electrode and the second electrode each independently include at least one selected from Ag, Mg, Cu, Al, Pt, Pd, Au, Ni, Nd, Ir, Cr, Li, Ca, LiF/Ca, LiF/Al, Mo, Ti, In, Sn or Zn, compounds of two or more selected therefrom, mixtures of two or more selected therefrom, and oxides thereof, and the emission layer includes the polycyclic compound.

In one or more embodiments, the emission layer may emit delayed fluorescence.

In one or more embodiments, the emission layer may be a delayed fluorescence emission layer including a first compound and a second compound, and the first compound may include the polycyclic compound.

In one or more embodiments, the emission layer may be a thermally activated delayed fluorescence emission layer emitting (e.g., to emit) blue light.

BRIEF DESCRIPTION OF THE DRAWINGS

The accompanying drawings are included to provide a further understanding of the present disclosure and are incorporated in and constitute a part of this specification. The drawings illustrate example embodiments of the present disclosure and, together with the description, serve to explain principles of the present disclosure. In the drawings.

DETAILED DESCRIPTION

Figure 1:
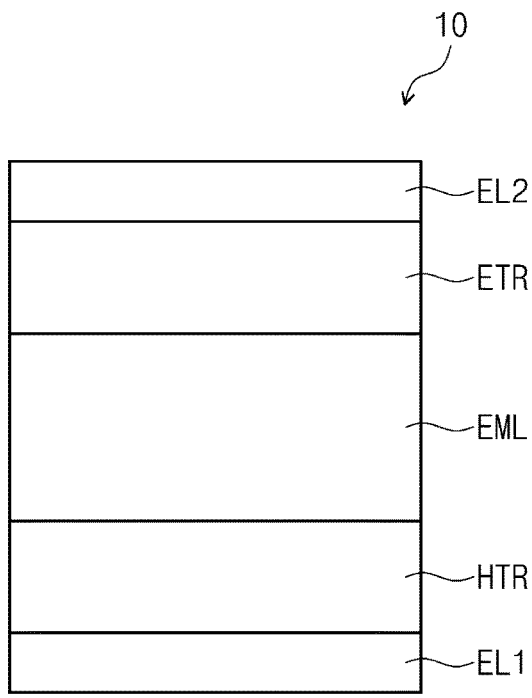
FIG. 1 is a cross-sectional view schematically illustrating an organic electroluminescence device according to one or more embodiments of the present disclosure.

The present disclosure may have various modifications and may be embodied in different forms, and example embodiments will be explained in more detail with reference to the accompany drawings. The present disclosure may, however, be embodied in different forms and should not be construed as limited to the embodiments set forth herein. Rather, all modifications, equivalents, and substituents which are included in the spirit and technical scope of the present disclosure should be included in the present disclosure.

It will be understood that when an element (or region, layer, part, etc.) is referred to as being "on", "connected to" or "coupled to" another element, it can be directly on, connected or coupled to the other element (without any intervening elements therebetween), or one or more third intervening elements may be present.

Like reference numerals refer to like elements throughout. In addition, in the drawings, the thickness, the ratio, and the dimensions of constituent elements are exaggerated for effective explanation of technical contents.

The term "and/or" includes one or more combinations which may be defined by relevant elements. Expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure."

It will be understood that, although the terms first, second, etc. may be used herein to describe various elements, these elements should not be limited by these terms. These terms are only used to distinguish one element from another element. Thus, a first element could be termed a second element without departing from the teachings of the present disclosure. Similarly, a second element could be termed a first element. As used herein, the singular forms are intended to include the plural forms as well, unless the context clearly indicates otherwise.

In addition, the terms "below", "beneath", "on" and "above" are used for explaining the relation of elements shown in the drawings. The terms are relative concept and are explained based on the direction shown in the drawing.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

Hereinafter, the organic electroluminescence device according to one or more embodiments of the present disclosure will be explained with reference to attached drawings.

FIGS. 1 to 4 are cross-sectional views schematically showing organic electroluminescence devices according to example embodiments of the present disclosure. Referring to FIGS. 1 to 4, in an organic electroluminescence device 10 according to one or more embodiments, a first electrode EL1 and a second electrode EL2 are oppositely disposed, and between the first electrode EL1 and the second electrode EL2, an emission layer EML may be disposed.

In one or more embodiments, the organic electroluminescence device 10 of one or more embodiments further includes a plurality of functional layers between the first electrode EL1 and the second electrode EL2, in addition to the emission layer EML. The plurality of the functional layers may include a hole transport region HTR and an electron transport region ETR. For example, the organic electroluminescence device 10 of one or more embodiments may include a first electrode EL1, a hole transport region HTR, an emission layer EML, an electron transport region ETR, and a second electrode, stacked one by one. In one or more embodiments, the organic electroluminescence device 10 of one or more embodiments may include a capping layer CPL disposed on the second electrode EL2.

The organic electroluminescence device 10 of one or more embodiments includes a polycyclic compound of one or more embodiments, which will be explained hereinbelow, in the emission layer EML disposed between the first electrode EL1 and the second electrode EL2. However, one or more embodiments of the present disclosure is not limited thereto, and the organic electroluminescence device 10 may include the polycyclic compound of one or more embodiments in the hole transport region HTR or the electron transport region ETR, which are part of a plurality of the functional layers disposed between the first electrode EL1 and the second electrode EL2, or may include the polycyclic compound in a capping layer CPL disposed on the second electrode EL2, in addition to the emission layer EML.

Figure 2:
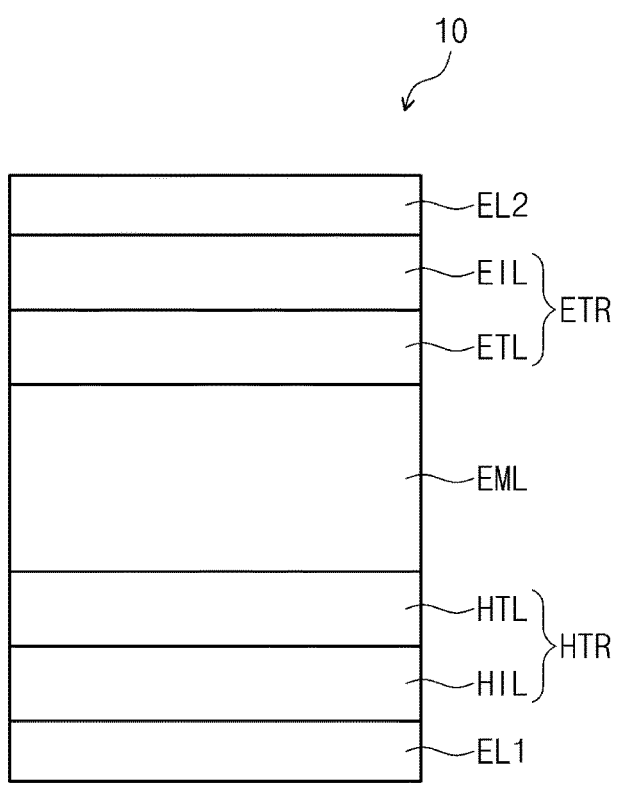
FIG. 2 is a cross-sectional view schematically illustrating an organic electroluminescence device according to one or more embodiments of the present disclosure.
Figure 3:
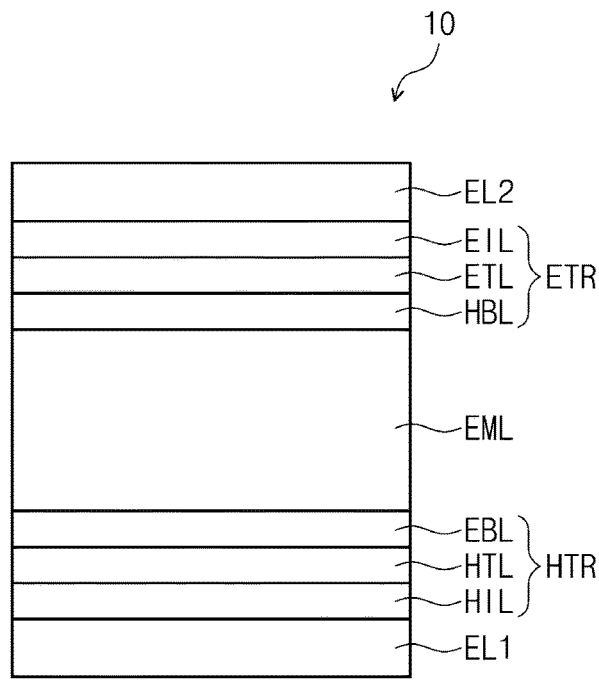
FIG. 3 is a cross-sectional view schematically illustrating an organic electroluminescence device according to one or more embodiments of the present disclosure.
Figure 4:
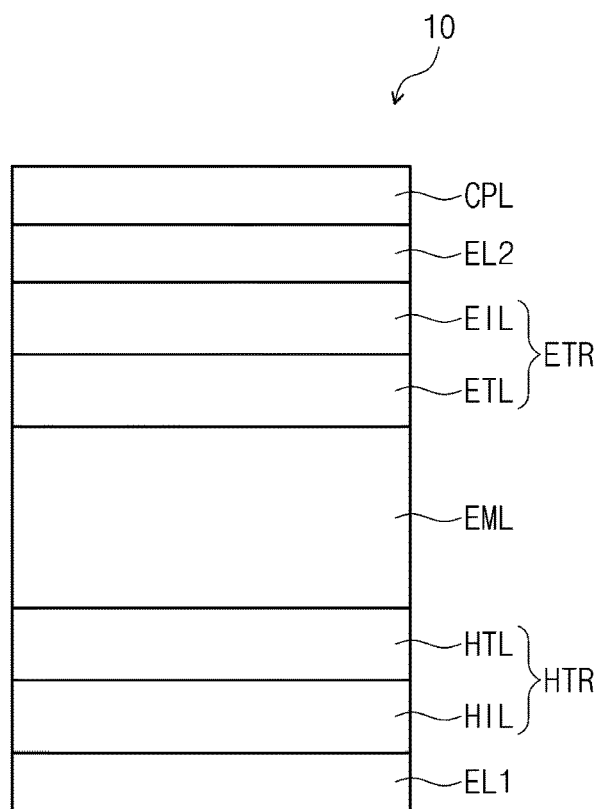
FIG. 4 is a cross-sectional view schematically illustrating an organic electroluminescence device according to one or more embodiments of the present disclosure.

Meanwhile, when compared with FIG. 1, FIG. 2 shows the cross-sectional view of an organic electroluminescence device 10 of one or more embodiments, wherein a hole transport region HTR includes a hole injection layer HIL and a hole transport layer HTL, and an electron transport region ETR includes an electron injection layer EIL and an electron transport layer ETL. In one or more embodiments, when compared with FIG. 1, FIG. 3 shows the cross-sectional view of an organic electroluminescence device 10 of one or more embodiments, wherein a hole transport region HTR includes a hole injection layer HIL, a hole transport layer HTL, and an electron blocking layer EBL; and an electron transport region ETR includes an electron injection layer EIL, an electron transport layer ETL, and a hole blocking layer HBL. When compared with FIG. 2, FIG. 4 shows the cross-sectional view of an organic electroluminescence device 10 of one or more embodiments, further including a capping layer CPL disposed on the second electrode EL2.

The first electrode EL1 has conductivity. The first electrode EL1 may be formed using a metal alloy or any suitable conductive compound. The first electrode EL1 may be a pixel electrode or an anode. The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), and/or indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, In, Sn, Zn, a compound thereof, a mixture thereof (for example, a mixture of Ag and Mg), or an oxide thereof. In some embodiments, the first electrode EL1 may have a structure including a plurality of layers including a reflective layer or a transflective layer formed using any of the above materials, and a transmissive conductive layer formed using ITO, IZO, ZnO, and/or ITZO. For example, the first electrode EL1 may include a three-layer structure of ITO/Ag/ITO. However, the embodiments of the present disclosure are not limited thereto. The thickness of the first electrode EU may be from about 1,000 Å to about 10,000 Å, for example, from about 1,000 Å to about 3,000 Å.

The hole transport region HTR is provided on the first electrode EL1. The hole transport region HTR may include at least one of a hole injection layer HIL, a hole transport layer HTL, a hole buffer layer, or an electron blocking layer EBL.

The hole transport region HTR may have a single layer (e.g., a single layer structure) formed using (e.g., consisting of) a single material, a single layer formed using a plurality of different materials, or a multilayer structure including a plurality of layers formed using a plurality of different materials.

For example, the hole transport region HTR may have the structure of a single layer of a hole injection layer HIL, or a hole transport layer HTL, and may have a structure of a single layer formed using a hole injection material and a hole transport material. In some embodiments, the hole transport region HTR may have a structure of a single layer formed using a plurality of different materials, or a structure stacked from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed using one or more suitable methods selected from a vacuum deposition method, a spin coating method, a cast method, a Langmuir-Blodgett (LB) method, an inkjet printing method, a laser printing method, and a laser induced thermal imaging (LITI) method.

The hole injection layer HIL may include, for example, a phthalocyanine compound (such as copper phthalocyanine); N,N'-diphenyl-N,N'-bis-[4-(phenyl-m-tolyl-amino)-phenyl]-biphenyl-4,4'-diamine (DNTPD), 4,4',4''-[tris(3-methylphenyl)phenylamino] triphenylamine (m-MTDATA), 4,4', 4''-tris(N,N-diphenylamino)triphenylamine (TDATA), 4,4', 4''-tris{N,-2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPD), triphenylamine-containing polyetherketone (TPAPEK), 4-isopropyl-4'-methyldiphenyliodonium [tetrakis(pentafluorophenyl)borate], and/or dipyrazino[2,3-f:2',3'-h]quinoxaline-2,3,6,7,10,11-hexacarbonitrile (HAT-CN).

The hole transport layer HTL may include any suitable materials, for example, carbazole derivatives (such as N-phenyl carbazole and/or polyvinyl carbazole), fluorine-based derivatives, N,N'-bis(3-methylphenyl)-N,N'-diphenyl-[1,1-biphenyl]-4,4'-diamine (TPD), triphenylamine-based derivatives such as 4,4',4''-tris(N-carbazolyl) triphenylamine (TCTA), N,N'-di(naphthalene-1-yl)-N,N'-diphenyl-benzidine (NPD), 4,4'-cyclohexylidene bis[N,N-bis(4-methylphenyl)benzeneamine (TAPC), 3,3'-dimethyl-N4,N4,N4',N4'-tetra-m-tolyl-1,1'-biphenyl]-4,4'-diamine (HMTPD), 1,3-bis(N-carbazolyl)benzene (mCP), etc.

The electron blocking layer EBL may include, for example, carbazole derivatives (such as N-phenyl carbazole and/or polyvinyl carbazole), fluorene-based derivatives, N,N'-bis(3-methylphenyl)-N,N'-diphenyl-[1,1-biphenyl]-4, 4'-diamine (TPD), triphenylamine-based derivatives such as 4,4',4''-tris(N-carbazolyl)triphenylamine (TCTA), N,N'-di (1-naphthalene-1-yl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino-3,3'-dimethylbiphenyl] (HMTPD), mCP, etc.

The thickness of the hole transport region HTR may be from about 50 Å to about 15,000 Å, for example, from about 100 Å to about 5,000 Å. The thickness of the hole injection region HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL and the electron blocking layer EBL each independently satisfy their respective above-described ranges, satisfactory (or suitable) hole transport properties may be achieved without substantial increase of a driving voltage.

The hole transport region HTR may further include a charge generating material, in addition to the above-described materials, to increase conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, without limitation. Non-limiting examples of the p-dopant may include quinone derivatives (such as tetracyanoquinodimethane (TCNQ) and/or 2,3,5,6-tetrafluoro-7,7',8,8'-tetracyanoquinodimethane (F4-TCNQ)), and metal oxides (such as tungsten oxide and/or molybdenum oxide), without limitation.

As described above, the hole transport region HTR may further include at least one of a hole butter layer or an electron blocking layer EBL, in addition to the hole injection layer HIL and the hole transport layer HTL. The hole buffer layer may compensate an optical resonance distance according to the wavelength of light emitted from an emission layer EML and may increase light emission efficiency. Any of the materials which may be included in a hole transport region HTR may be used as materials included in a hole buffer layer. The electron blocking layer EBL is a layer playing the role of preventing or reducing the electron injection from the electron transport region ETR to the hole transport region HTR.

The emission layer EML is provided on the hole transport region HTR. The emission layer EML may have a thickness of, for example, about 100 Å to about 1,000 Å, or about 100 Å to about 300 Å. The emission layer EML may have a single layer (e.g., a single layer structure) formed using (e.g., consisting of) a single material, a single layer formed using a plurality of different materials, or a multilayer structure having a plurality of layers formed using a plurality of different materials.

The emission layer EML may emit one among red light, green light, blue light, white light, yellow light and cyan light. The emission layer EML may include a fluorescence emitting material or a phosphorescence emitting material.

In one or more embodiments, the emission layer EML may be a fluorescence emission layer. For example, a part of light emitted from the emission layer EML may be thermally activated delayed fluorescence (TADF). For example, the emission layer EML may include a light emitting component emitting (to emit) thermally activated delayed fluorescence, and in one or more embodiments, the emission layer EML may be a thermally activated delayed fluorescence emission layer emitting (to emit) blue light.

The emission layer EML of the organic electroluminescence device 10 of one or more embodiments includes the polycyclic compound according to one or more embodiments of the present disclosure.

In the description, the term "substituted or unsubstituted" corresponds to a group that is unsubstituted or is substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In one or more embodiments, each of the exemplified substituents may be substituted or unsubstituted. For example, a biphenyl group may be interpreted as an aryl group or a phenyl group substituted with a phenyl group.

In the description, the term "forming a ring via the combination with an adjacent group" may mean forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The ring formed by the combination with an adjacent group may be a monocyclic ring or a polycyclic ring. In one or more embodiments, the ring formed via the combination with an adjacent group may be combined with another ring to form a spiro structure.

In the description, the term "adjacent group" may refer to a pair of substituent groups where the first substituent is connected to an atom which is directly connected to another atom substituted with the second substituent; a pair of substituent groups connected to the same atom; or a pair of substituent groups where the first substituent is sterically positioned at the nearest position to the second substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

In the description, examples of the halogen atom may include a fluorine atom, a chlorine atom, a bromine atom, and an iodine atom.

In the description, the alkyl group may be a linear, branched or cyclic alkyl group. The carbon number of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the alkenyl group means a hydrocarbon group including one or more carbon double bonds in the middle of and/or at either terminal of an alkyl group of 2 or more carbon atoms. The alkenyl group may be a linear chain or a branched chain alkenyl group. The carbon number is not specifically limited, but may be 2 to 30, 2 to 20, or 2 to 10. Examples of the alkenyl group include a vinyl group, a 1-butenyl group, a 1-pentenyl group, a 1,3-butadienyl aryl group, a styrenyl group, a styrylvinyl group, etc., without limitation.

In the description, the alkynyl group means a hydrocarbon group including one or more carbon triple bonds in the middle of and/or at either terminal of an alkyl group of 2 or more carbon atoms. The alkynyl group may be a linear chain or a branched chain alkynyl group. The carbon number is not specifically limited, but may be 2 to 30, 2 to 20, or 2 to 10. Examples of the alkynyl group include an ethynyl group, a propynyl group, etc., without limitation.

In the description, the hydrocarbon ring group may be an optional functional group or substituent derived from an aliphatic hydrocarbon ring, or an optional functional group or substituent derived from an aromatic hydrocarbon ring. The carbon number of the hydrocarbon ring group for forming a ring may be 5 to 60, 5 to 30, or 5 to 20.

In the description, the aryl group means an optional functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sextphenyl, triphenylenyl, pyrenyl, benzofluoranthenyl, chrysenyl, etc., without limitation.

In the description, the heterocyclic group means an optional functional group or substituent derived from a ring including one or more among B, O, N, P, Si and S as heteroatoms. The heterocyclic group includes an aliphatic heterocyclic group and an aromatic heterocyclic group. The aromatic heterocyclic group may be a heteroaryl group. The aliphatic heterocycle and aromatic heterocycle may each independently be a monocycle or a polycycle.

In the description, the heterocyclic group may include one or more among B, O, N, P, Si and S as heteroatoms. If the heterocyclic group includes two or more heteroatoms, the two or more heteroatoms may be the same or different. The heterocyclic group may be a monocyclic heterocyclic group or a polycyclic heterocyclic group, and has the concept including a heteroaryl group. The carbon number for forming a ring of the heterocyclic group may be 2 to 30, 2 to 20, or 2 to 10.

In the description, the aliphatic heterocyclic group may include one or more among B, O, N, P, Si and S as heteroatoms. The carbon number for forming a ring of the aliphatic heterocyclic group may be 2 to 30, 2 to 20, or 2 to 10. Examples of the aliphatic heterocyclic group may be an oxirane group, a thiirane group, a pyrrolidine group, a piperidine group, a tetrahydrofuran group, a tetrahydrothiophene group, a thiane group, a tetrahydropyran group, a 1,4-dioxane group, etc., without limitation.

In the description, the heteroaryl group may include one or more among B, O, N, P, Si and S as heteroatoms. If the heteroaryl group includes two or more heteroatoms, two or more heteroatoms may be the same or different. The heteroaryl group may be a monocyclic heteroaryl group or polycyclic heteroaryl group. The carbon number for forming a ring of the heteroaryl group may be 2 to 30, 2 to 20, or 2 to 10. Examples of the heteroaryl group may include thiophene, furan, pyrrole, imidazole, triazole, pyridine, bipyridine, pyrimidine, triazine, triazole, acridine, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxazole, oxadiazole, thiadiazole, phenothiazine, dibenzosilole, dibenzofuran, etc., without limitation.

In the description, the amine group may include an alkyl amine group, an aryl amine group or a heteroaryl amine group. For example, in the amine group, the above-defined alkyl group, aryl group, or heteroaryl group may be combined with a nitrogen atom. Examples of the amine group include a methylamine group, a dimethylamine group, a phenylamine group, a diphenylamine group, a naphthylamine group, a 9-methyl-anthracenylamine group, a triphenylamine group, etc., without limitation.

In the description, the thiol group may include an alkyl thio group and an aryl thio group. For example, in the thiol group, the above-defined alkyl group or aryl group may be combined with a sulfur atom. Examples of the thiol group include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., without limitation.

In the description, the boron group includes an alkyl boron group and an aryl boron group. For example, in the boron group, the above-defined alkyl group or aryl group may be combined with a boron atom. Examples of the boron group include a trimethylboron group, a triethylboron group, a t-butyldimethylboron group, a triphenylboron group, a diphenylboron group, a phenylboron group, etc., without limitation.

In the description, the oxy group may include an alkoxy group and an aryl oxy group. For example, in the oxy group, the above-defined alkyl group or aryl group may be combined with an oxygen atom. Examples of the oxy group may include methoxy, ethoxy, n-propoxy, isopropoxy, butoxy, pentyloxy, hexyloxy, octyloxy, nonyloxy, decyloxy, benzyloxy, etc. However, one or more embodiments of the present disclosure are not limited thereto.

In the description, "atoms for forming a ring" may refer to ring-forming atoms.

The polycyclic compound according to one or more embodiments of the present disclosure is represented by the following Formula 1:

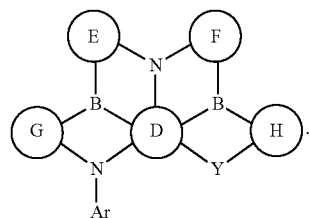

Formula 1

In Formula 1, Y is O or S.

In Formula 1, ring D to ring H may be each independently a substituted or unsubstituted aryl ring of 6 to 30 carbon atoms for forming a ring, or a substituted or unsubstituted heteroaryl ring of 2 to 30 carbon atoms for forming a ring. In one or more embodiments, ring E and ring F are combined with each other to form a ring. In one or more embodiments, ring F and ring H are combined with each other to form a ring. In one or more embodiments, ring G and ring E are combined with each other to form a ring. In one or more embodiments, ring G and Ar are combined with each other to form a ring. In one or more embodiments, ring D and Ar are combined with each other to form a ring. Ring E and ring F, ring F and ring H, ring G and Ring E, ring G and Ar, and ring D and Ar may each independently be combined with each other via a direct linkage (e.g., a single bond) or a substituent, to form a ring.

In Formula 1, Ar is a substituted or unsubstituted aryl group of 6 to 30 carbon atoms for forming a ring or a substituted or unsubstituted heteroaryl group of 2 to 30 carbon atoms for forming a ring.

In one or more embodiments, Ar of Formula 1 may be represented by the following Formula 2:

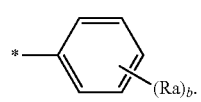

Formula 2

In Formula 2, Ra is a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or may be combined with an adjacent group to form a ring.

In Formula 2, "b" is an integer of 0 to 5. If "b" is an integer of 2 or more, a plurality of Ra groups are the same or different.

In one or more embodiments, Formula 1 may be represented by the following Formula 3:

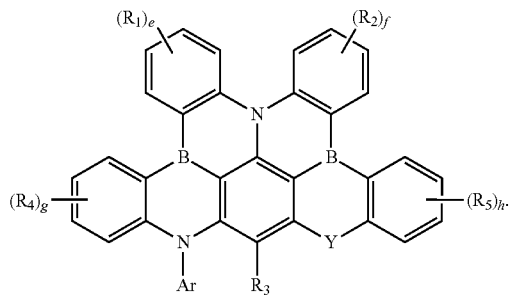

Formula 3 in Formula 3, $R_1$ to $R_5$ are each independently a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or may be combined with an adjacent group to form a ring.

In Formula 3, "e" is an integer of 0 to 4, wherein, if "e" is an integer of 2 or more, a plurality of $R_1$ groups are the same or different.

In Formula 3, "f" is an integer of 0 to 4, wherein, if "f" is an integer of 2 or more, a plurality of $R_2$ groups are the same or different.

In Formula 3, "g" is an integer of 0 to 4, wherein, if "g" is an integer of 2 or more, a plurality of $R_4$ groups are the same or different.

In Formula 3, "h" is an integer of 0 to 4, wherein, if "h" is an integer of 2 or more, a plurality of $R_5$ groups are the same or different.

In Formula 3, Y and Ar are the same as defined in Formula 1.

In one or more embodiments, $R_1$ to $R_5$ of Formula 3 may be each independently a hydrogen atom, a deuterium atom, a substituted or unsubstituted arylamine group, a substituted or unsubstituted phenyl group, a substituted or unsubstituted carbazole group, a substituted or unsubstituted dibenzofuran group, or a substituted or unsubstituted dibenzothiophene group.

In one or more embodiments, at least one of $R_1$ to $R_5$ may be a substituted or unsubstituted amine group or a substituted or unsubstituted N-containing heteroaryl group.

In one or more embodiments, Formula 3 may be represented by the following Formula 4-1 or Formula 4-2:

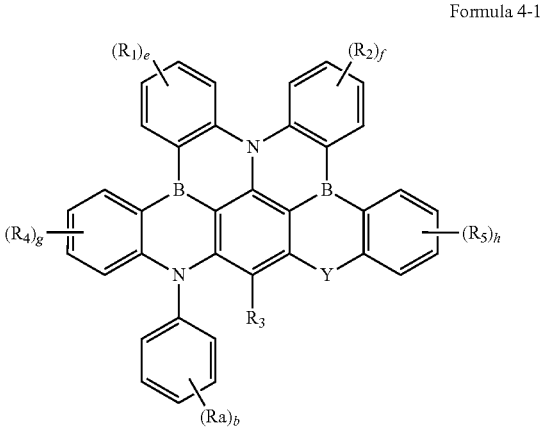

Formula 4-1

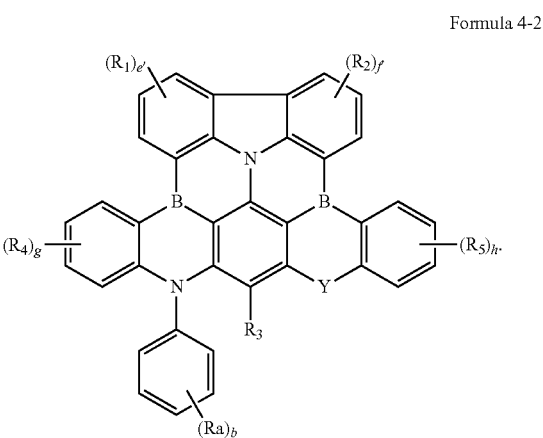

Formula 4-2

In Formula 4-1 and Formula 4-2, Ra is a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or may be combined with an adjacent group to form a ring.

In Formula 4-1 and Formula 4-2, "b" is an integer of 0 to 5, wherein, if "b" is an integer of 2 or more, a plurality of Ra groups are the same or different.

In Formula 4-1 and Formula 4-2, "e'" and "f'" are each independently an integer of 0 to 3. If "e'" is an integer of 2 or more, a plurality of $R_1$ groups are the same or different, and if "f'" is an integer of 2 or more, a plurality of $R_2$ groups are the same or different.

In Formula 4-1 and Formula 4-2, Y, $R_1$ to $R_5$, and "e" to "h" are the same as defined in Formula 3.

In one or more embodiments, Formula 4-1 may be represented by the following Formula 5-1 or Formula 5-2:

Formula 5-1

![Formula 5-1 structure]

Formula 5-2

![Formula 5-2 structure]

In Formula 5-1 and Formula 5-2, $R_4'$ and $R_5'$ may be each independently a hydrogen atom, a deuterium atom, a substituted or unsubstituted arylamine group, a substituted or unsubstituted phenyl group, a substituted or unsubstituted carbazole group, a substituted or unsubstituted dibenzofuran group or a substituted or unsubstituted dibenzothiophene group.

In Formula 5-1 and Formula 5-2, "g'" and "h'" are each independently an integer of 0 to 3. If "g'" is an integer of 2 or more, a plurality of $R_4$ groups are the same or different, and if "h'" is an integer of 2 or more, a plurality of $R_5$ groups are the same or different.

In Formula 5-1 and Formula 5-2, Y, $R_1$ to $R_5$, Ra, "b" and "e" to "h" are the same as defined in Formula 4-1.

In one or more embodiments, Y in Formula 1, and Formula 3 to Formula 5-2 may be O.

In one or more embodiments, the polycyclic compound represented by Formula 1 may be at least one among the compounds represented in the following Compound Group 1, but one or more embodiments of the present disclosure are not limited thereto:

Compound Group 1

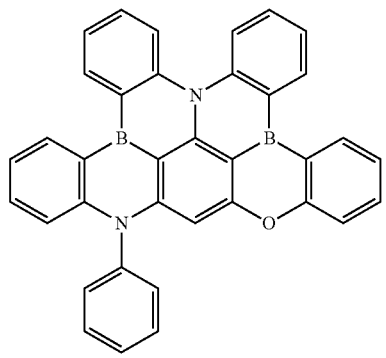

1

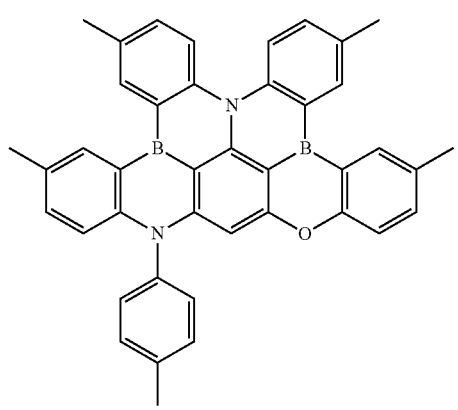

2

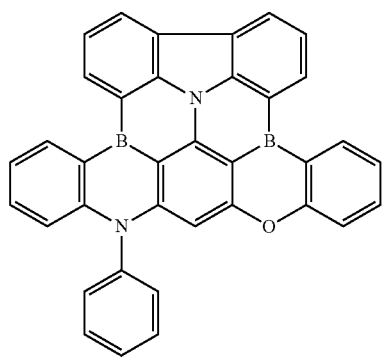

3

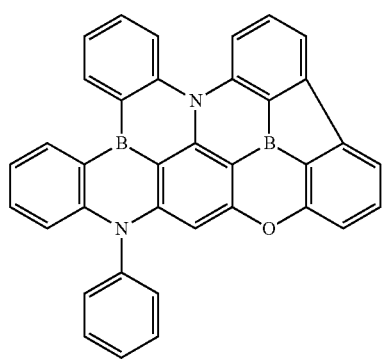

4

17
-continued
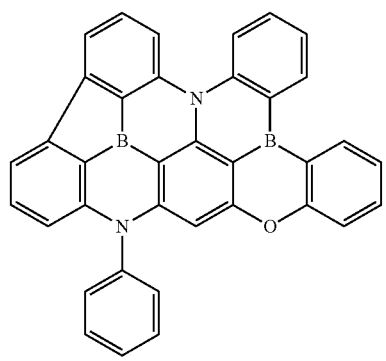
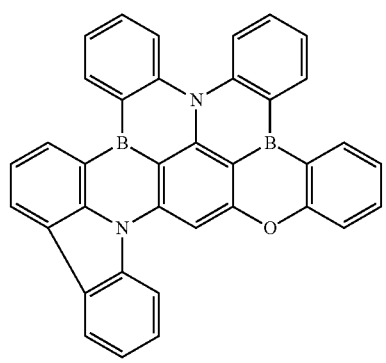
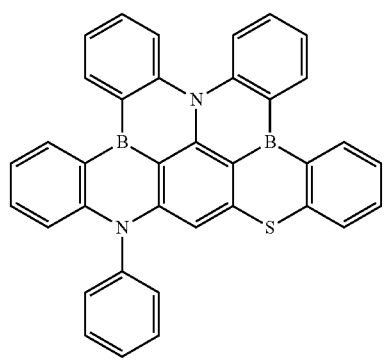
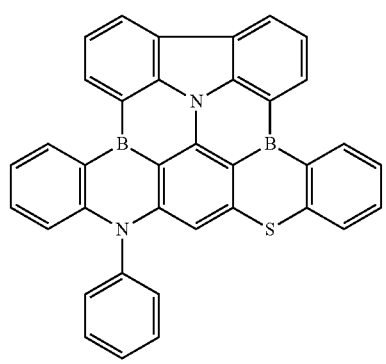
18
-continued
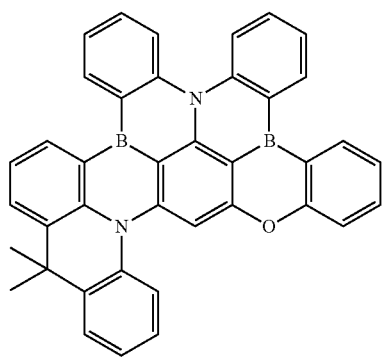
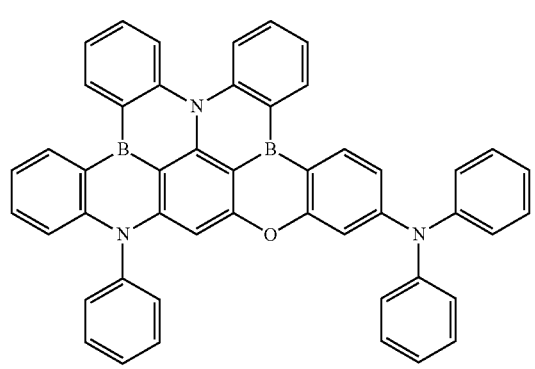
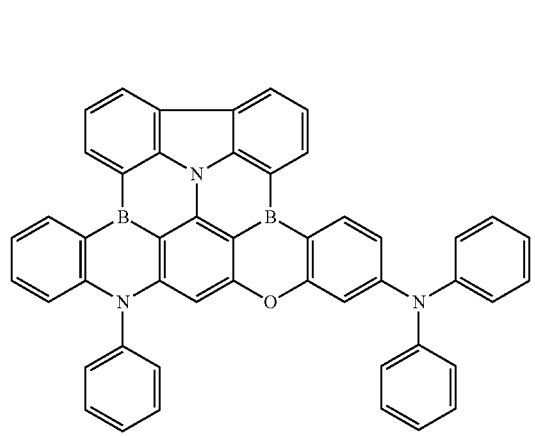
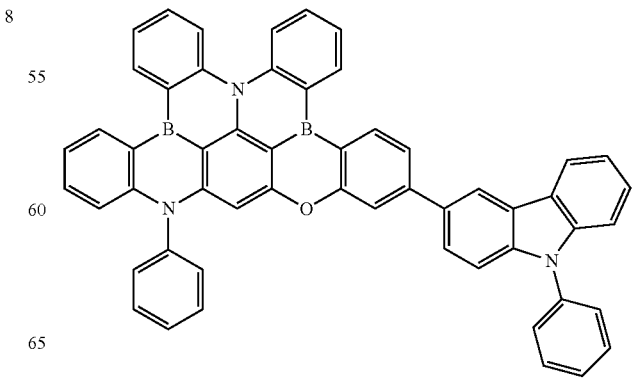

13
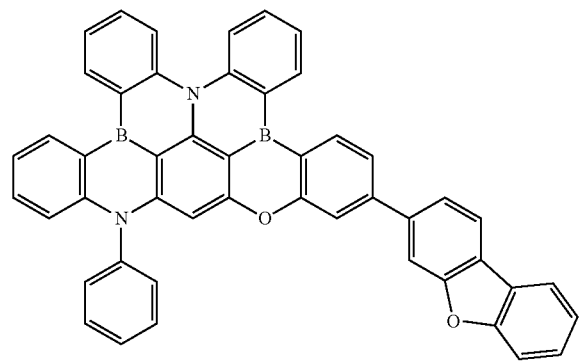
14
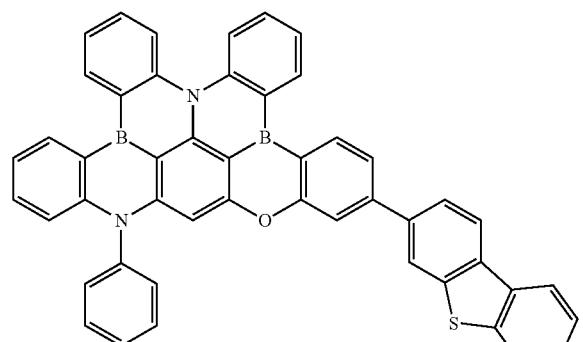
15
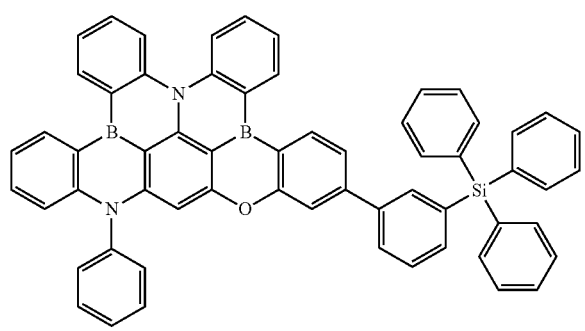
16
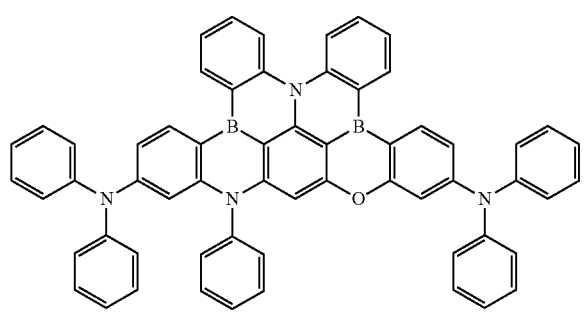
17
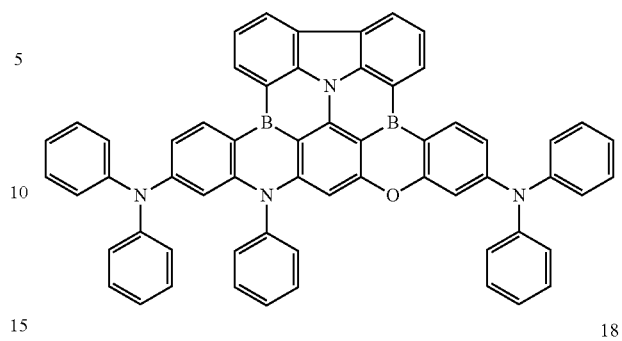
18
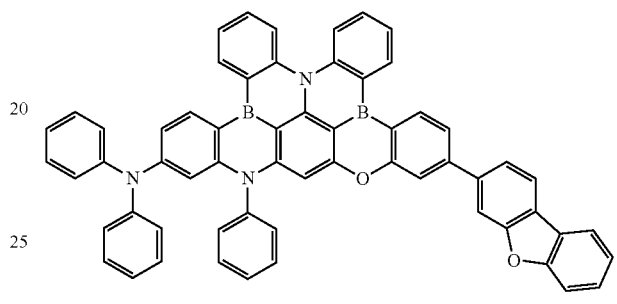
19
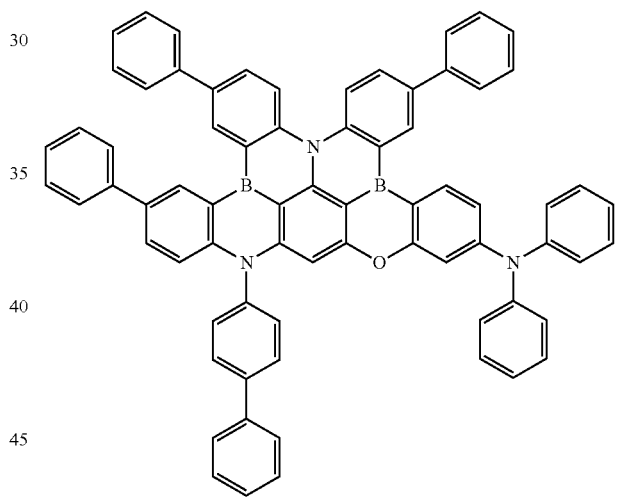
20
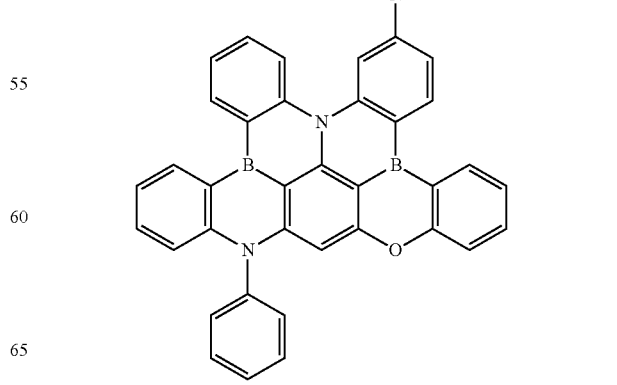

21
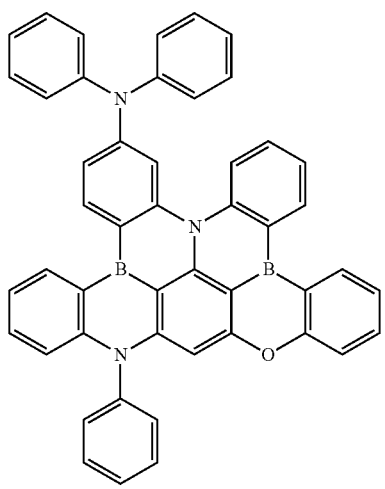
22
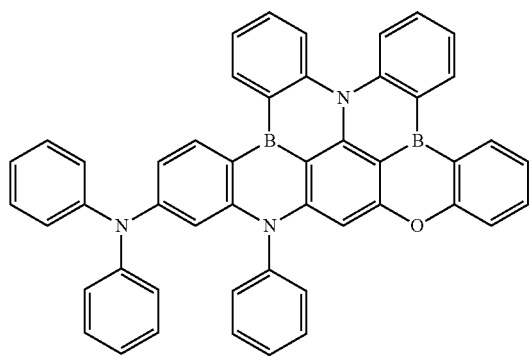
23
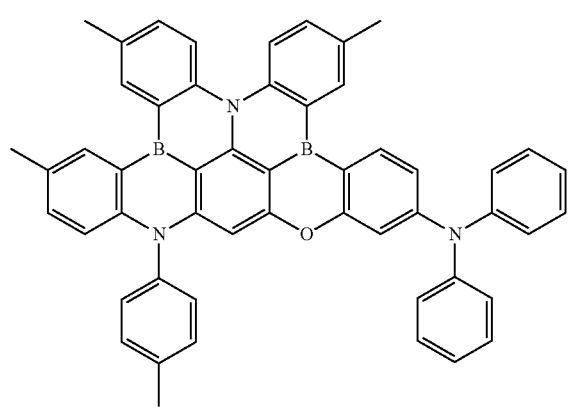
24
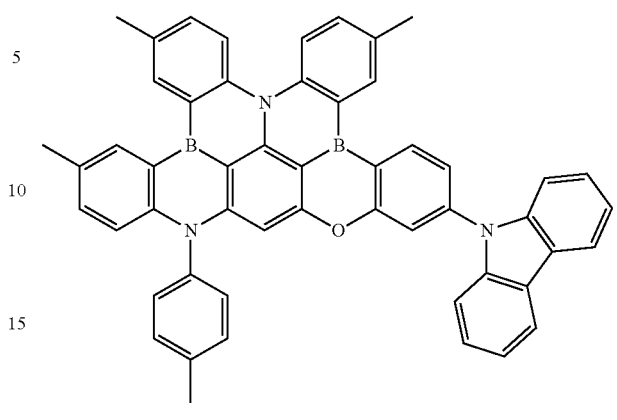
25
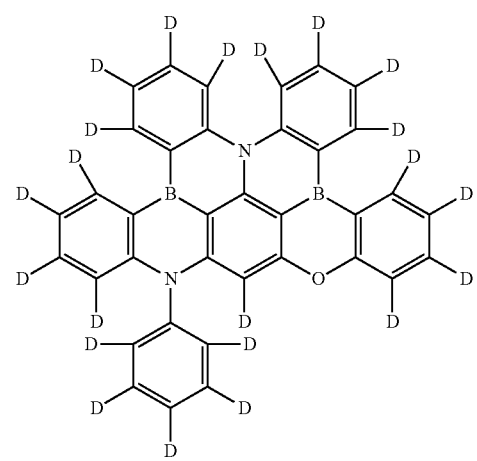
26
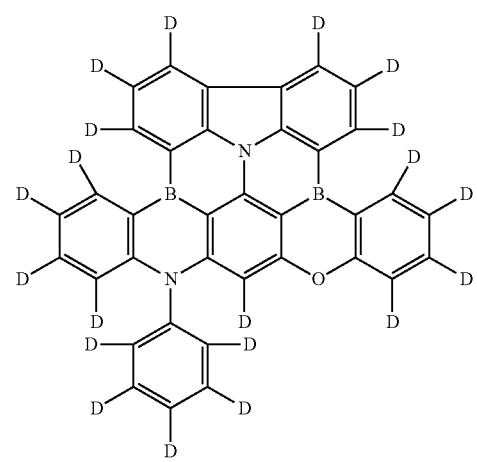

-continued

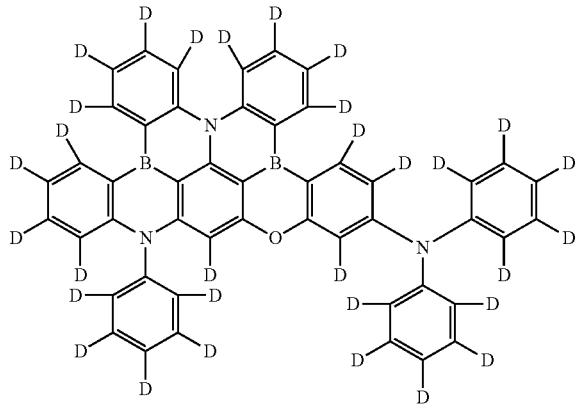

27

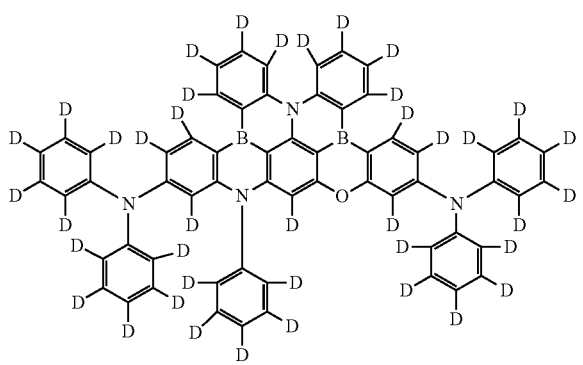

28

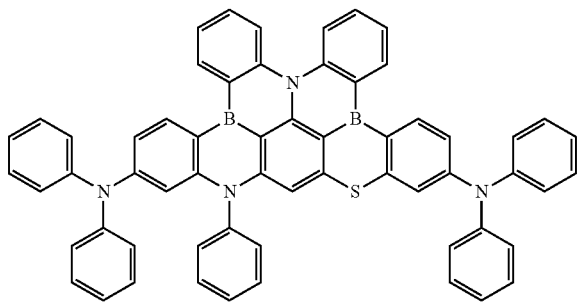

29

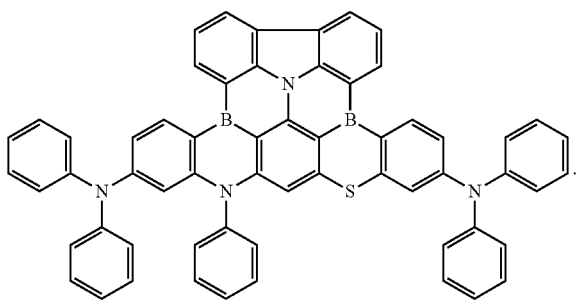

30

The polycyclic compound may be used in the organic electroluminescence device 10 of one or more embodiments to improve the efficiency and life of the organic electroluminescence device. For example, the polycyclic compound may be used in the emission layer EML of the organic electroluminescence device 10 of one or more embodiments to improve the emission efficiency and life of the organic electroluminescence device.

In one or more embodiments, the emission layer EML may be a delayed fluorescence emission layer including a first compound and a second compound, and the polycyclic compound of one or more embodiments represented by Formula 1 may be included in the first compound of the emission layer EML. For example, the first compound may be a dopant, and the second compound may be a host.

In one or more embodiments, the host may be a host for emitting (e.g., to emit) delayed fluorescence, and the dopant may be a dopant for emitting (e.g., to emit) delayed fluorescence. In one or more embodiments, the polycyclic compound represented by Formula 1 may be included as the dopant material of the emission layer EML. For example, the polycyclic compound of one or more embodiments represented by Formula 1 may be used as a TADF dopant.

In one or more embodiments, the organic electroluminescence device 10 of one or more embodiments may include a plurality of emission layers. The plurality of emission layers may be stacked one by one. For example, the organic electroluminescence device 10 including a plurality of emission layers may emit white light. The organic electroluminescence device including the plurality of emission layers may be an organic electroluminescence device having a tandem structure. If the organic electroluminescence device 10 includes a plurality of emission layers, at least one emission layer EML may include the polycyclic compound according to the present disclosure as described above.

The emission layer EML may further include a dopant material, and the dopant may use any suitable material. For example, at least one among styryl derivatives (for example, 1,4-bis[2-(3-N-ethylcarbazoryl)vinyl]benzene (BCzVB), 4-(di-p-tolylamino)-4"-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, 1,4-bis(N,N-diphenylamino)pyrene, 1,6-bis(N,N-diphenylamino)pyrene, and/or 1,3,5-tris(1-phenyl-1H-benzo[d]imidazole-2-yl)benzene (TPBi)), etc. may be used as the dopant, without limitation.

The emission layer EML may further include any suitable material as a host material. For example, the emission layer EML may include, as a host material, at least one among tris(8-hydroxyquinolino)aluminum (Alq$_3$), bis[2-(diphenylphosphino)phenyl]ether oxide (DPEPO), 4,4'-bis(N-carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), poly(N-vinylcarbazole) (PVK), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH-2), hexaphenylcyclotrisiloxane (DPSiO$_3$), octaphenylcyclotetrasiloxane (DPSiO$_4$), 2,8-bis(diphenylphosphoryl)dibenzofuran (PPF), and 1,3,5-tris(1-phenyl-1H-benzo[d]imidazol-2-yl)benzene (TPBi), without limitation.

In case where the emission layer EML emits red light, the emission layer EML may further include, for example, a fluorescence material including tris(dibenzoylmethanato) phenanthroline europium (PBD:Eu(DBM)$_3$(Phen)) and/or perylene. In case where the emission layer EML emits red light, the dopant included in the emission layer EML may be selected from, for example, a metal complex and an organometallic complex (such as bis(1-phenylisoquinoline) acetylacetonate iridium (PIQIr(acac)), bis(1-phenylquinoline)acetylacetonate iridium (PQIr(acac)), tris(1-phenylquinoline)iridium (PQIr) and/or octaethylporphyrin platinum (PtOEP)), rubrene and the derivatives thereof, and 4-dicyanomethylene-2-(p-dimethylaminostyryl)-6-methyl-4H-pyrane (DCM) and the derivatives thereof.

In case where the emission layer EML emits green light, the emission layer EML may further include, for example, a fluorescence material including tris(8-hydroxyquinolino) aluminum ($Alq_3$). In case where the emission layer EML emits green light, the dopant included in the emission layer EML may be selected from, for example, a metal complex and an organometallic complex (such as fac-tris(2-phenylpyridine)iridium ($Ir(ppy)_3$)), and coumarin and the derivatives thereof.

In case where the emission layer EML emits blue light, the emission layer EML may further include a fluorescence material including at least one selected from the group consisting of spiro-DPVBi, spiro-6P, distyryl-benzene (DSB), distyryl-arylene (DSA), a polyfluorene (PFO)-based polymer and a poly(p-phenylene vinylene (PPV)-based polymer. In case where the emission layer EML emits blue light, the dopant included in the emission layer EML may be selected from, for example, a metal complex and an organometallic complex (such as (4,6-F2ppy)2Irpic), and perylene and the derivatives thereof.

In the organic electroluminescence device 10 of one or more embodiments, as shown in FIGS. 1 to 4, the electron transport region ETR is provided on the emission layer EML. The electron transport region ETR may include at least one of an electron blocking layer HBL, an electron transport layer ETL, or an electron injection layer EIL. However, one or more embodiments of the present disclosure are not limited thereto.

The electron transport region ETR may have a single layer (e.g., a single layer structure) formed using (e.g., consisting of) a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. In some embodiments, the electron transport region ETR may have a single layer structure having a plurality of different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be, for example, from about 1,000 Å to about 1,500 Å.

The electron transport region ETR may be formed using one or more suitable methods selected from a vacuum deposition method, a spin coating method, a cast method, a Langmuir-Blodgett (LB) method, an inkjet printing method, a laser printing method, and a laser induced thermal imaging (LITI) method.

If the electron transport region ETR includes an electron transport layer ETL, the electron transport region ETR may include an anthracene-based compound. The electron transport region may include an anthracene compound. The electron transport region may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, bis[2-(diphenylphosphino)phenyl]ether oxide (DPEPO), 2-(4-(N-phenylbenzoimidazole-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate ($Bebq_2$), 9,10-di(naphthalene-2-yl)anthracene (ADN), or a mixture thereof, without limitation. The thickness of the electron transport layer ETL may be from about 100 Å to about 1,000 Å, and may be, for example, from about 150 Å to about 500 Å. If the thickness of the electron transport layer ETL satisfies the above-described range, satisfactory (or suitable) electron transport properties may be obtained without substantial increase of a driving voltage.

If the electron transport region ETR includes the electron injection layer EIL, the electron transport region ETR may include, a metal halide (such as LiF, NaCl, CsF, RbCl and/or RbI), a metal in lanthanoides (such as Yb), a metal oxide (such as $Li_2O$ and/or BaO), and/or 8-hydroxyl-lithium quinolate (LiQ). However, one or more embodiments of the present disclosure are not limited thereto. The electron injection layer EIL also may be formed using a mixture material of an electron transport material and an insulating organo metal salt. The organo metal salt may be a material having an energy band gap of about 4 eV or more. For example, the organo metal salt may be selected from metal acetates, metal benzoates, metal acetoacetates, metal acetylacetonates, and metal stearates. The thickness of the electron injection layer EIL may be from about 1 Å to about 100 Å, for example, from about 3 Å to about 90 Å. If the thickness of the electron injection layer EIL satisfies the above described range, satisfactory (or suitable) electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), bis[2-(diphenylphosphino)phenyl]ether oxide (DPEPO), or 4,7-diphenyl-1,10-phenanthroline (Bphen). However, one or more embodiments of the present disclosure are not limited thereto.

The second electrode EL2 is provided on the electron transport region ETR. The second electrode EL2 may be a common electrode and/or a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb In, Sn, Zn, a compound thereof, a mixture thereof (for example, AgMg, AgYb, and/or MgAg) and/or an oxide thereof. In one or more embodiments, the second electrode EL2 may have a multilayered structure including a reflective layer or a transflective layer formed using any of the above-described materials and a transparent conductive layer formed using ITO, IZO, ZnO, ITZO, etc.

In one or more embodiments, the second electrode EL2 may be connected with an auxiliary electrode. When the second electrode EL2 is connected with the auxiliary electrode, the resistance of the second electrode EL2 may decrease.

Referring to FIG. 4, on the second electrode EL2 of the organic electroluminescence device 10 of one or more embodiments, a capping layer (CPL) may be further included. The capping layer CPL may have a single layer or a multilayer structure.

In one or more embodiments, the capping layer CPL may be an organic layer or an inorganic layer. For example, if the capping layer CPL includes an inorganic material, the inorganic material may include alkali metal compounds (such as LiF), alkaline earth compounds (such as $MgF_2$, SiON, $SiN_x$, and/or $SiO_y$), etc.

For example, if the capping layer (CPL) includes an organic material, the organic material may include α-NPD, NPB, TPD, m-MTDATA, $Alq_3$, CuPc, N4,N4,N4',N4'-tetra (biphenyl-4-yl) biphenyl-4,4'-diamine (TPD15), 4,4',4"-tris (carbazol sol-9-yl) triphenylamine (TCTA), an epoxy resin, and/or acrylate such as methacrylate. However, one or more embodiments of the present disclosure are not limited thereto, and the capping layer CPL may include an amine compound. For example, the capping layer CPL may include at least one among Compounds P1 to P5 below:

P1

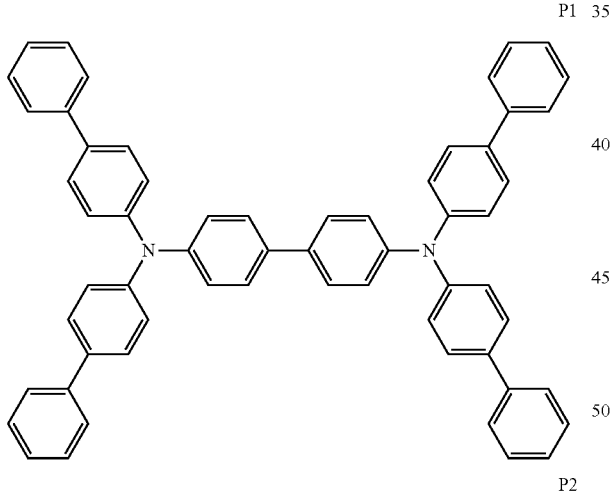

P2

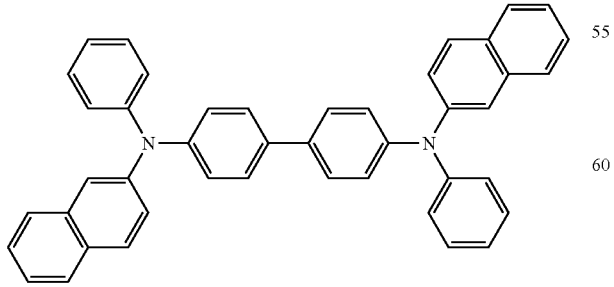

P3

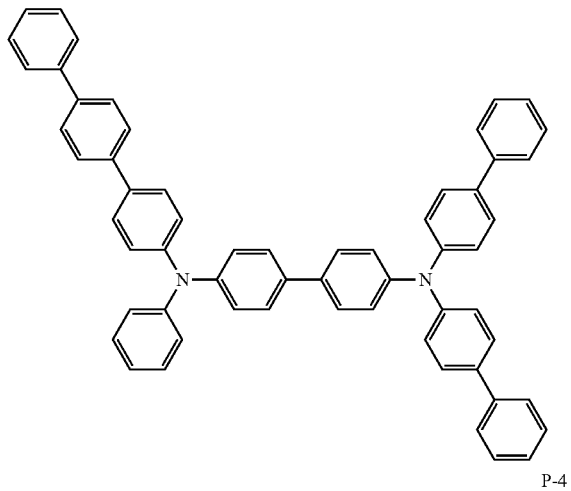

P-4

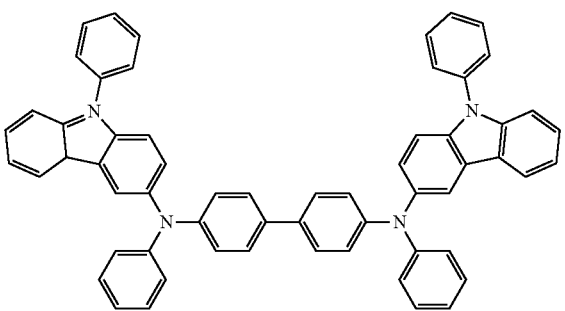

P-5

The refractive index (index of refraction) of the capping layer CPL may be 1.6 or more. For example, the refractive index of the capping layer CPL may be 1.6 or more with respect to light in a wavelength range of about 550 nm to about 660 nm.

In the organic electroluminescence device 10, according to the application of voltages to the first electrode EL1 and the second electrode EL2, respectively, holes injected from the first electrode EL1 move through the hole transport region HTR to the emission layer EML, and electrons injected from the second electrode EL2 move through the electron transport region ETR to the emission layer EML.

Electrons and holes recombine in the emission layer EML to produce excitons, and light is emitted via the transition of the excitons from an excited state to a ground state.

If the organic electroluminescence device 10 is a top emission device, the first electrode EL1 may be a reflective electrode, and the second electrode EL2 may be a transmissive or transflective electrode. If the organic electroluminescence device 10 is a bottom emission device, the first electrode EL1 may be a transmissive or transflective electrode, and the second electrode EL2 may be a reflective electrode.

The organic electroluminescence device 10 according to one or more embodiments of the present disclosure is characterized in including the polycyclic compound represented by Formula 1, and showing high efficiency and long life. In one or more embodiments, the organic electroluminescence device 10 of one or more embodiments may show high efficiency and long life characteristics in a deep blue wavelength region.

Hereinafter, the present disclosure will be particularly explained referring to embodiments and comparative embodiments. The following embodiments are only illustrations to assist the understanding of the present disclosure, and the scope of the present disclosure is not limited thereto.

Examples

Synthesis of Polycyclic Compounds

The synthetic methods of the polycyclic compounds explained below are only embodiments, and the synthetic method of the polycyclic compound according to one or more embodiments of the present disclosure is not limited thereto.

1. Synthesis of Compound 1

(1) Synthesis of Compound A-1

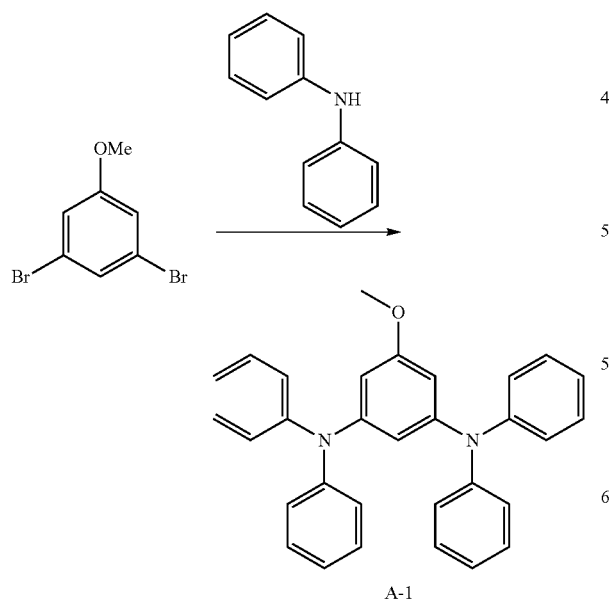

1,3-dibromo-5-methoxybenzene (25.0 g, 94.0 mmol), diphenylamine (35.0 g, 206.8 mmol), Pd(dba)$_2$ (2.7 g, 4.7 mmol), P(tBu)3HBF4 (1.6 g, 5.6 mmol), tBuONa (31.6 g, 329.0 mmol), and toluene (376 ml) were refluxed and stirred for about 4 hours under an Ar atmosphere. The reaction product was separated by silica gel column, and washed with hexane to obtain 32.8 g (yield 79%) of a white solid. By the Fast Atom Bombardment-Mass Spectroscopy (FAB-MS) measurement of the compound thus obtained, a molecular weight of 442 was confirmed, and a target Compound A-1 was confirmed.

(2) Synthesis of Compound A-2

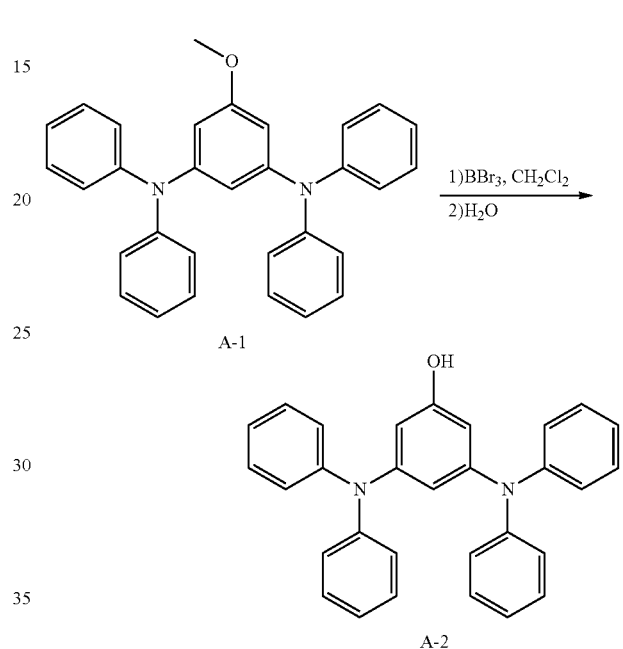

Compound A-1 (25 g, 56.5 mmol) and 300 ml of DCM were placed in a reaction vessel, and BBr$_3$ (28.3 g, 113.0 mmol) was added thereto in small quantities while stirring at about −78° C. After adding the entire BBr$_3$, the temperature was elevated to room temperature, and stirring was performed for about 24 hours at room temperature. After separating the reaction mixture by silica gel column, the reaction product was washed with DCM and AcOEt to obtain 13.9 g (yield 57%) of a white solid. By the FAB-MS measurement of the compound thus obtained, a molecular weight of 428 was confirmed, and a target Compound A-2 was confirmed.

(3) Synthesis of Compound A-3

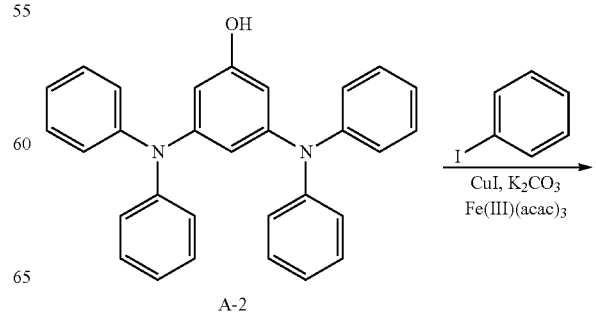

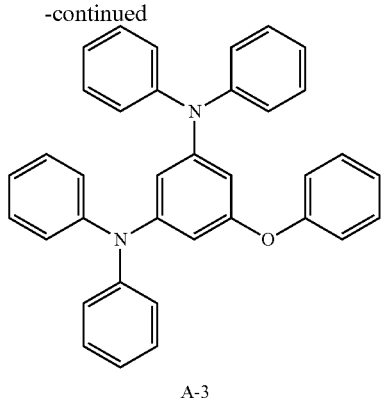

A-3

Compound A-2 (15 g, 35.0 mmol), iodobenzene (21.4 g, 105.0 mmol), K₂CO₃ (32.3 g, 140.0 mmol), CuI (0.333 g, 0.05 mmol), Fe(III)(acac) (1.24 g, 0.10 mmol), and 700 ml of NMP were stirred under an Ar atmosphere at about 180° C. for about 9 hours, and the reaction product was separated by silica gel column to obtain 3.62 g (yield 21%) of a yellowish white solid. By the FAB-MS measurement of the compound thus obtained, a molecular weight of 504 was confirmed, and a target Compound A-3 was confirmed.

(4) Synthesis of Compound 1

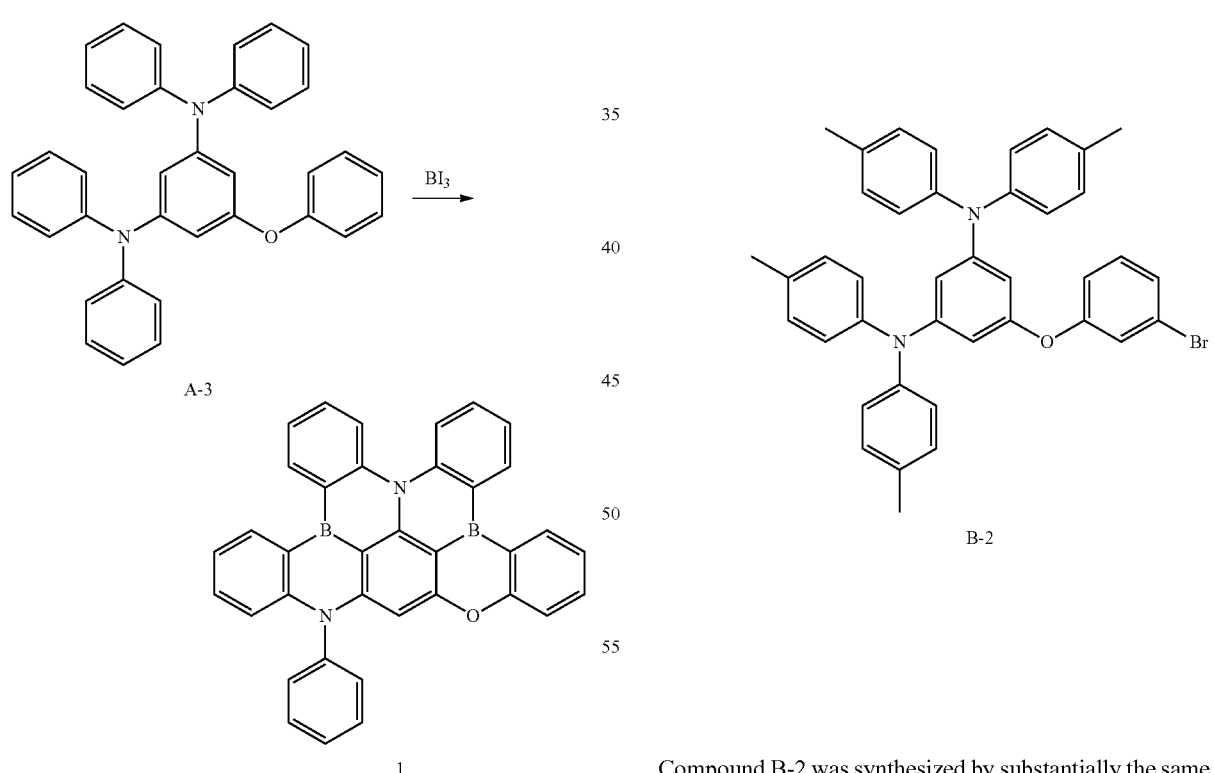

Compound A-3 (3.6 g, 7.13 mmol), BI₃ (14.0 g, 35.7 mmol), BPh₃ (3.45 g, 14.3 mmol), and 143 ml of 1,2,4-trichlorobenzene were stirred under an Ar atmosphere at about 180° C. for about 6 hours. Then, the temperature was reduced to about 120° C., and N,N-diisopropylethylamine (18.4 ml, 107.0 mmol) was added thereto, followed by stirring for about 30 minutes. The crude product thus obtained was separated by silica gel column to obtain 0.557 g (yield 15%) of a yellow solid. By the FAB-MS measurement of the compound thus obtained, a molecular weight of 520 was confirmed, and a target Compound 1 was confirmed.

2. Synthesis of Compound 23

(1) Synthesis of Compound B-2

Compound B-2 was synthesized by substantially the same method as the synthetic method of Compound A-3, except for using Compound B-1 instead of Compound A-2 and using 1,3-dibromobenzene instead of iodobenzene. The target material was obtained in a yield of 19%. By the FAB-MS measurement of the compound thus obtained, a molecular weight of 639 was confirmed, and a target Compound B-2 was confirmed.

(2) Synthesis of Compound B-3

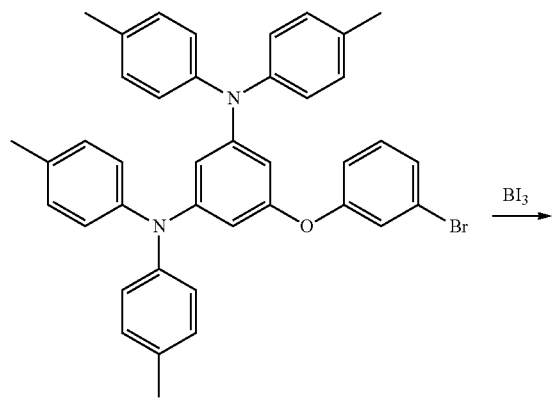

B-2

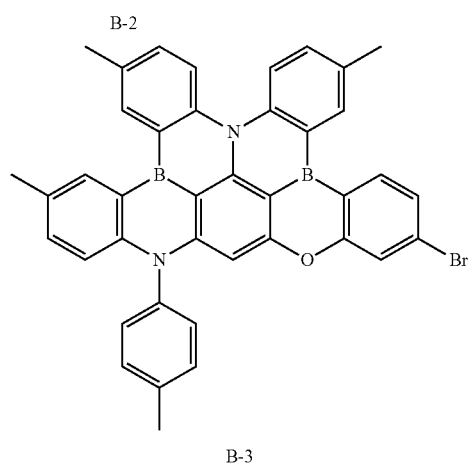

B-3

Compound B-3 was synthesized by substantially the same method as the synthetic method of Compound 1, except for using Compound B-2 instead of Compound A-3. The target material was obtained in a yield of 15%. By the FAB-MS measurement of the compound thus obtained, a molecular weight of 655 was confirmed, and a target Compound B-3 was confirmed.

(3) Synthesis of Compound 23

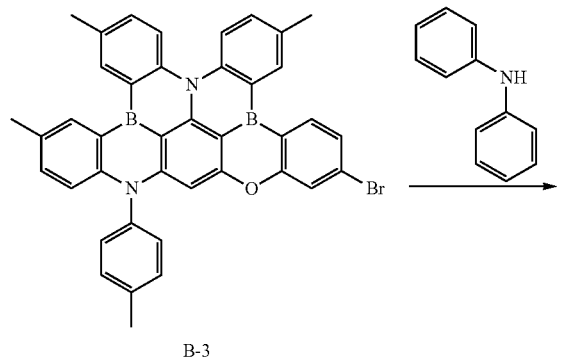

B-3

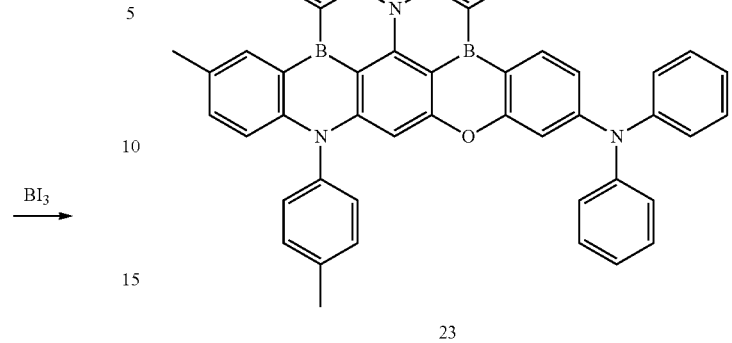

23

Compound B-3 (10.0 g, 15.3 mmol), diphenylamine (DPA) (2.58 g, 15.3 mmol), tBuONa (1.54 g, 16.0 mmol), Pd(dba)$_2$ (0.439 g, 0.760 mmol), Sphos (0.376 g, 0.920 mmol), and 153 ml of toluene were placed in a reaction vessel and refluxed and reacted under an Ar atmosphere for about 4 hours. The crude product thus obtained was separated by silica gel column to obtain 7.66 g (yield 68%) of a yellow solid. %. By the FAB-MS measurement of the compound thus obtained, a molecular weight of 743 was confirmed, and a target Compound 23 was confirmed.

3. Synthesis of Compound 24

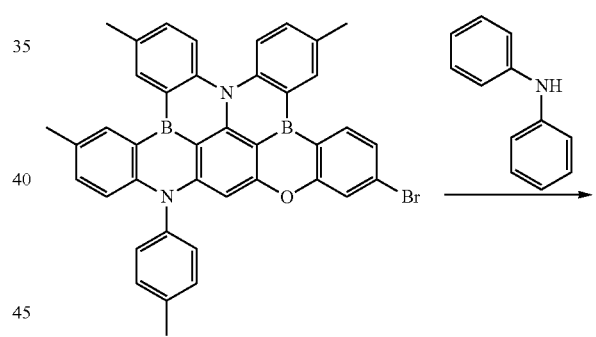

C-1

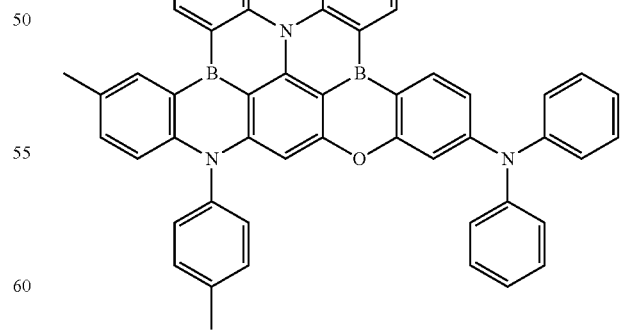

24

Compound 24 was synthesized by substantially the same method as the synthetic method of Compound 23, except for using carbazole instead of DPA. The target material was obtained in a yield of 43%. By the FAB-MS measurement of the compound thus obtained, a molecular weight of 655 was confirmed, and a target Compound 24 was confirmed.

4. Synthesis of Compound 3

(1) Synthesis of Compound D-1

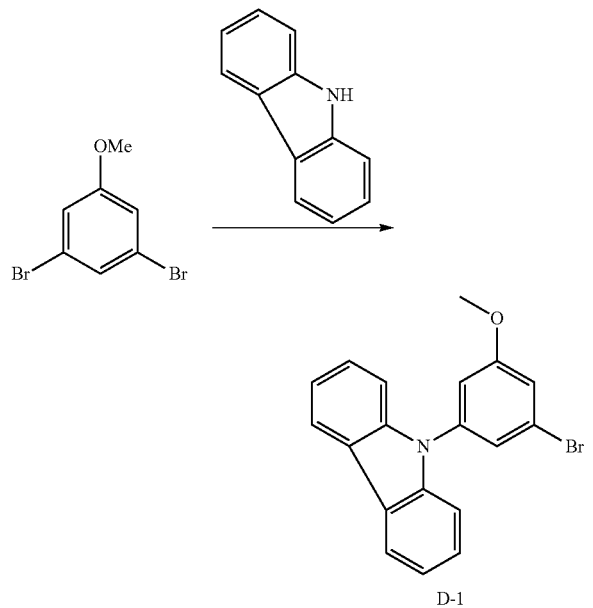

D-1

Compound D-1 was synthesized by substantially the same method as the synthetic method of Compound A-1, except for using carbazole instead of DPA and using tBu-benzene instead of toluene. The reaction was performed at about 150° C., and the target material was obtained in a yield of 39%. By the FAB-MS measurement of the compound thus obtained, a molecular weight of 352 was confirmed, and a target Compound D-1 was confirmed.

(2) Synthesis of Compound D-2

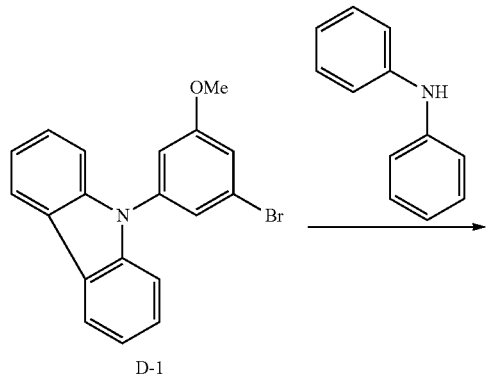

D-1

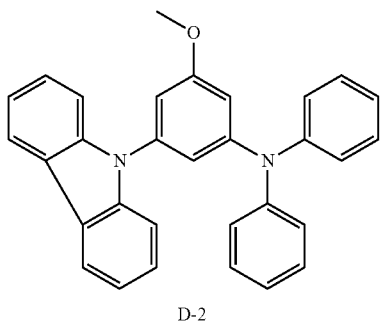

D-2

Compound D-1 (25.0 g, 71.0 mmol), diphenylamine (13.2 g, 78.1 mmol), Pd(dba)$_2$ (1.0 g, 1.8 mmol), P(tBu)$_3$HBF$_4$ (0.6 g, 2.1 mmol), tBuONa (11.9 g, 124.2 mmol), and toluene (284 ml) were refluxed and stirred under an Ar atmosphere for about 4 hours. The crude product was separated by silica gel column and washed with hexane to obtain 23.5 g (yield 75%) of a white solid. By the FAB-MS measurement of the compound thus obtained, a molecular weight of 440 was confirmed, and a target Compound D-2 was confirmed.

(3) Synthesis of Compound 3

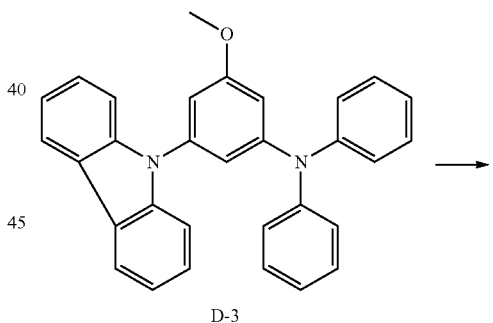

D-3

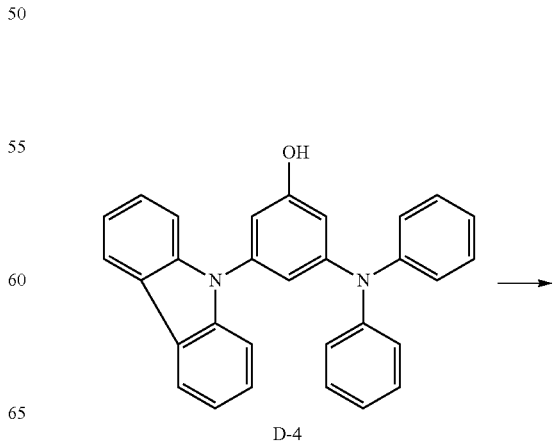

D-4

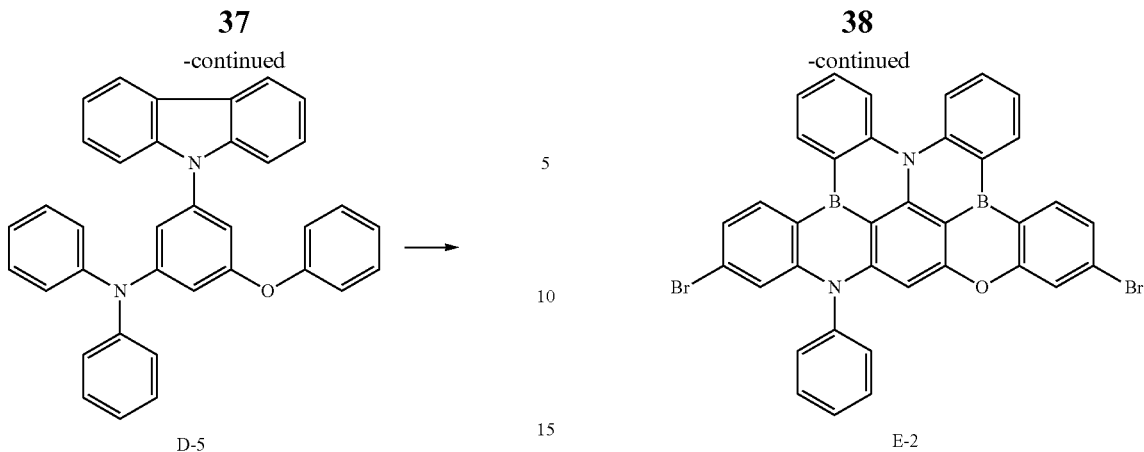

D-5

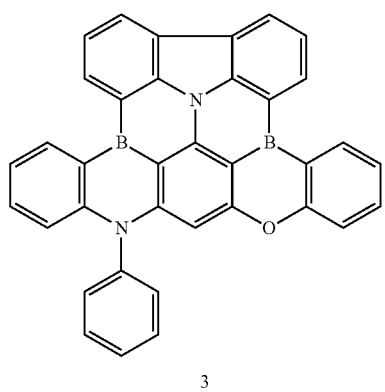

3

Compound D-3, Compound D-4, Compound D-5, and Compound 3 were synthesized by substantially the same methods as those used for synthesizing Compound A-1, Compound A-2, Compound A-3, and Compound 1, respectively, and a resulting yellow solid was obtained. By the FAB-MS measurement of the compound thus obtained, a molecular weight of 518 was confirmed, and a target Compound 3 was confirmed.

5. Synthesis of Compound 16

(1) Synthesis of Compound E-2

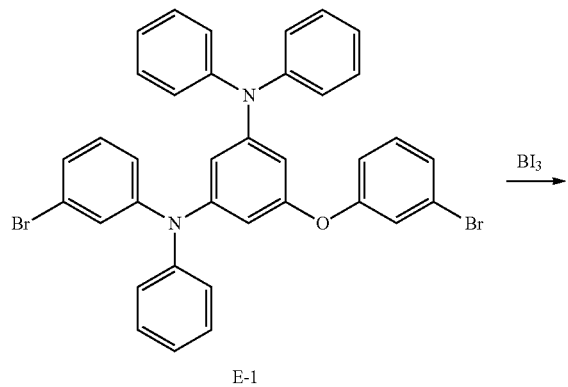

E-1

E-2

Compound E-2 was synthesized by substantially the same method as for synthesizing Compound 1, except for using E-1 instead of A-3, in a yield of 16%. By the FAB-MS measurement of the compound thus obtained, a molecular weight of 678 was confirmed, and a target Compound E-2 was confirmed.

(2) Synthesis of Compound 16

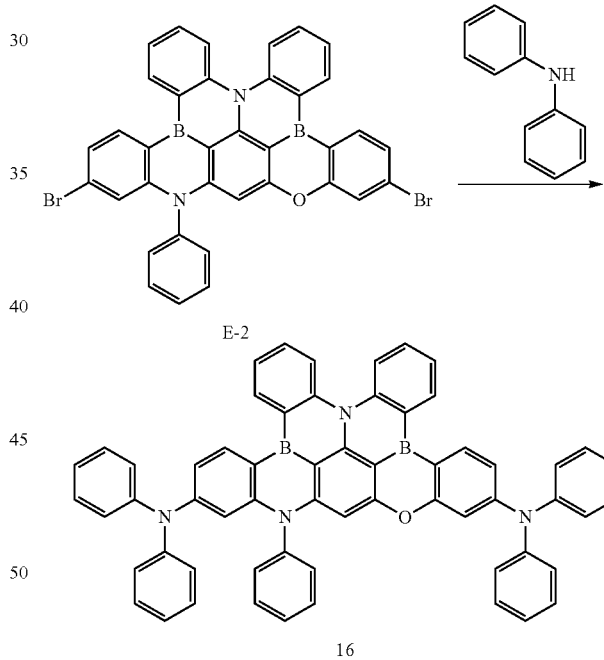

16

Compound 16 was synthesized by substantially the same method as for synthesizing Compound 23, except the equivalent number of DPA was increased by twice the amount used for synthesizing Compound 23, and the target material was obtained in a yield of 52%. By the FAB-MS measurement of the compound thus obtained, a molecular weight of 854 was confirmed, and a target Compound 16 was confirmed.

Manufacture of Organic Electroluminescence Device

Organic electroluminescence devices of Examples 1 to 5 were manufactured using the aforementioned compounds as materials for respective emission layers.

Example Compounds

1
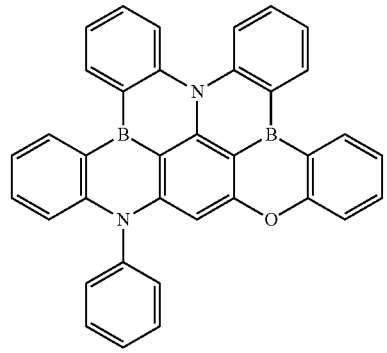

23
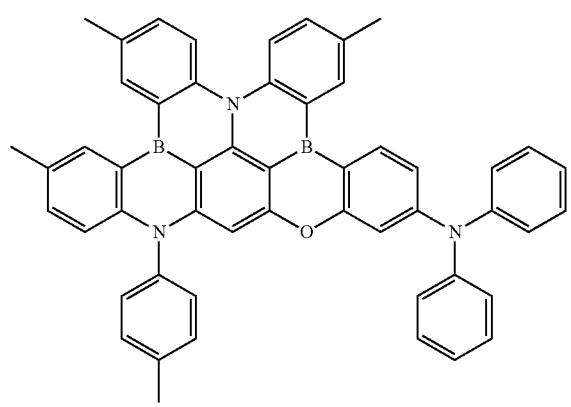

24
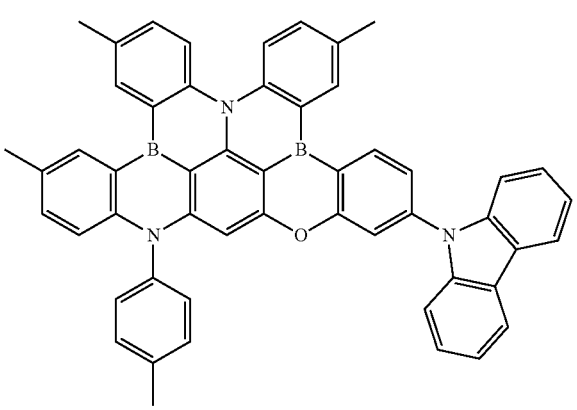

3
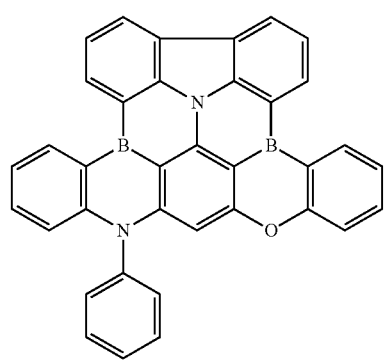

-continued

16
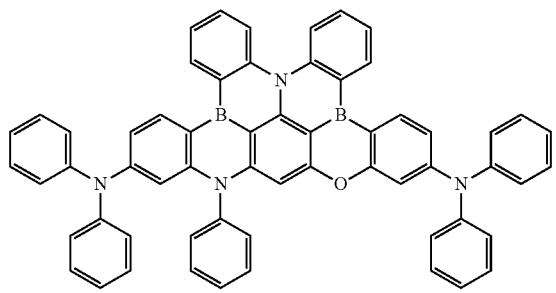

Organic electroluminescence devices of Comparative Examples 1 to 3 were manufactured using Comparative Compounds X-1 to X-3 as materials for respective emission layers.

Comparative Compounds

X-1
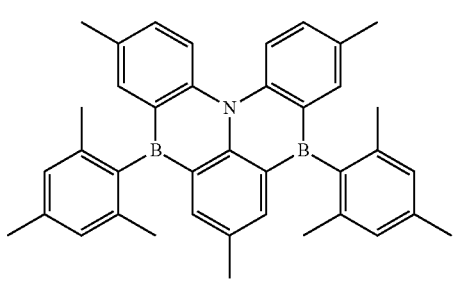

X-2
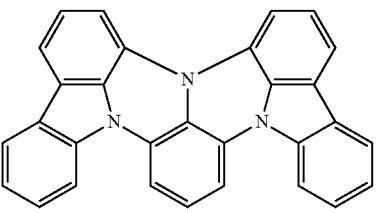

X-3
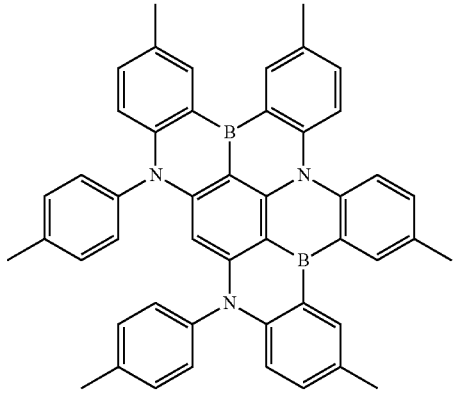

The organic electroluminescence devices of the Examples and Comparative Examples were each manufactured by the method below.

On a glass substrate, ITO with a thickness of about 1,500 Å was patterned, washed with ultra-pure water, and treated with UV ozone for about 10 minutes. Then, HAT-CN was deposited to a thickness of about 100 Å, α-NPD was deposited to about 800 Å, and mCP was deposited to a thickness of about 50 Å to form a hole transport region.

Then, the Example Compound or the Comparative Compound and mCBP were co-deposited in a ratio of 1:99 to form a layer into a thickness of about 200 Å to form an emission layer.

On the emission layer, a layer with a thickness of about 100 Å was formed using DPEPO, a layer with a thickness of about 300 Å was formed using TPBi, and a layer with a thickness of about 5 Å was formed using LiF to form an electron transport region. Then, a second electrode with a thickness of about 1,000 Å was formed using aluminum (Al). Then, Compound P4 was deposited to a thickness of about 70 nm to form a capping layer. All layers were formed using a vacuum deposition apparatus.

Evaluation of Properties of COMPOUNDS

With respect to Example Compounds and Comparative Compounds, a 5.0 mM toluene solution was controlled, and emission spectrum was measured at room temperature and 77K using JASCO V-670 spectrometer. The maximum emission wavelength ($\lambda$max) of emission spectrum at room temperature, and the full width at half maximum of emission spectrum were evaluated. In addition, from the onset values of the emission spectrum at 77K, a triplet energy level (T1) was computed.

TABLE 1

| Compound | $\lambda$max (nm) | FWHM (nm) | T1 (eV) |
|---|---|---|---|
| Example Compound 1 | 441 | 24 | 2.78 |
| Example Compound 23 | 454 | 23 | 2.60 |
| Example Compound 24 | 452 | 22 | 2.62 |
| Example Compound 3 | 455 | 23 | 2.59 |
| Example Compound 16 | 451 | 23 | 2.60 |
| Comparative Compound X-1 | 486 | 32 | 2.53 |
| Comparative Compound X-2 | 475 | 25 | 2.57 |
| Comparative Compound X-3 | 461 | 40 | 2.64 |

Evaluation of Properties of Organic Electroluminescence Devices

In order to evaluate the properties of the organic electroluminescence devices according to the Examples and Comparative Examples, maximum emission wavelength (nm), external quantum yield maximum value (%) and external quantum efficiency (%) at a luminance of 1,000 cd/m$^2$ were measured. A C9920-11 brightness light distribution characteristics measurement system of HAMAMATSU Photonics Co. was used for measurement.

TABLE 2

| | Emission layer dopant | Maximum emission wavelength (nm) | $EQE_{max}$ (%) | $EQE_{1000\ nit}$ (%) |
|---|---|---|---|---|
| Example 1 | Example Compound 1 | 449 | 18.7 | 13.4 |
| Example 2 | Example Compound 23 | 464 | 22.8 | 19.3 |
| Example 3 | Example Compound 24 | 462 | 20.2 | 17.6 |
| Example 4 | Example Compound 3 | 463 | 19.5 | 16.5 |
| Example 5 | Example Compound 16 | 461 | 23.1 | 20.5 |
| Comparative Example 1 | Comparative Compound X-1 | 501 | 13.6 | 4.8 |
| Comparative Example 2 | Comparative Compound X-2 | 490 | 12.1 | 4.5 |
| Comparative Example 3 | Comparative Compound X-3 | 462 | 16.3 | 8.6 |

Referring to the results of Table 1, it could be confirmed that the polycyclic compound according to one or more embodiments accomplished the decrease of the wavelength, the decrease of the full width at half maximum and the increase of the triplet energy level. Referring to the results of Table 2, it could be confirmed that the organic electroluminescence device including the polycyclic compound according to one or more embodiments in an emission layer showed improved external quantum efficiency maximum value ($EQE_{max}$) and external quantum efficiency ($EQE_{1000nit}$) when compared with the Comparative Examples. In addition, it could be confirmed that the deepening of blue color of the emission color might be accomplished.

The polycyclic compound according to one or more embodiments includes a crosslinked structure with chalcogen (e.g., oxygen) as a crosslinker, and a crosslinked structure with nitrogen as a crosslinker, and the sterical twist of a molecule could be induced. Accordingly, in the polycyclic compound according to one or more embodiments, the decrease of the wavelength and the increase of the triplet level energy may be generated due to the restraining (e.g., restricting) of conjugation in a molecule, and reverse intersystem crossing may be promoted. In addition, because the polycyclic compound according to one or more embodiments includes a crosslinked structure by chalcogen, narrow emission spectrum may be achieved without affecting the full width at half maximum of emission, and accordingly, an organic electroluminescence device emitting deep blue light with high efficiency and high color purity may be achieved.

In contrast, Compound X-1 of Comparative Example 1 includes mesityl groups having a large volume and bonded to boron, and has a standing structure with respect to a mother skeleton, and thus planarity in a molecule is low. Without being bound by any particular theory, it is thought that the structure relaxation of an excited state was large, and as a result, full width at half maximum was increased, and the deterioration of emission efficiency was generated.

Compound X-2 of Comparative Example 2 has a crosslinked structure with respect to a mother skeleton and becomes a molecule having very high planarity, and thus, achieves narrow full width at half maximum which is similar to the Examples. However, the structure of Compound X-2 is not a crosslinked structure by chalcogen (e.g., Compound X-2 does not have chalcogen as a crosslinker), but a crosslinked structure by a single bond, and molecular aggregation is generated by high planarity, which may have resulted in the increase of a wavelength and the deterioration of emission efficiency under high luminance.

Compound X-3 of Comparative Example 3 includes not a crosslinked structure by chalcogen but a crosslinked structure by arylamine (e.g., Compound X-3 has arylamine as a crosslinker). It was confirmed that Compound X-3 induced twist in a molecule by the crosslinked structure by arylamine, and a relative decrease of a wavelength, compared to Compounds X-1 and X-2, was achieved. However, Compound X-3 showed the structure relaxation of an excited state by the aryl group of an arylamine group, and as a result, it is thought that the full width at half maximum was increased, and the deterioration of device efficiency was generated.

The organic electroluminescence device of one or more embodiments uses the polycyclic compound represented by Formula 1 as a material for an emission layer, and high emission efficiency may be achieved in a blue light wavelength region.

The polycyclic compound of one or more embodiments is used as a material for an emission layer, and the high emission efficiency of an organic electroluminescence device could be achieved in a blue light wavelength region.

The organic electroluminescence device according to one or more embodiments of the present disclosure may attain high efficiency and long life.

The polycyclic compound according to one or more embodiments of the present disclosure may improve the life and efficiency of an organic electroluminescence device.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the example embodiments of the present disclosure have been described, it is understood that the present disclosure should not be limited to these example embodiments, but various changes and modifications can be made by one ordinary skilled in the art within the spirit and scope of the present disclosure as hereinafter claimed by the following claims and their equivalents.

What is claimed is:

1. An organic electroluminescence device, comprising:
a first electrode;
a hole transport region on the first electrode;
an emission layer on the hole transport region;
an electron transport region on the emission layer; and
a second electrode on the electron transport region,
wherein the first electrode and the second electrode each independently comprises at least one selected from Ag, Mg, Cu, Al, Pt, Pd, Au, Ni, Nd, Ir, Cr, Li, Ca, LiF/Ca, LiF/Al, Mo, Ti, In, Sn, Zn, compounds of two or more selected therefrom, mixtures thereof, and oxides thereof, and the emission layer comprises a polycyclic compound represented by Formula 1:

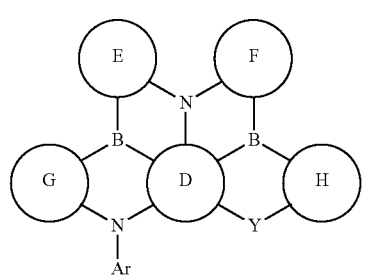

Formula 1 and
wherein in Formula 1,
Y is O or S,
ring D to ring H are each independently a substituted or unsubstituted aryl ring of 6 to 30 carbon atoms for forming a ring, or a substituted or unsubstituted heteroaryl ring of 2 to 30 carbon atoms for forming a ring, and/or ring E and ring F, ring F and ring H, ring G and ring E, ring G and Ar, and ring D and Ar are each independently combined with each other to form a ring, and
Ar is a substituted or unsubstituted aryl group of 6 to 30 carbon atoms for forming a ring or a substituted or unsubstituted heteroaryl group of 2 to 30 carbon atoms for forming a ring.

2. The organic electroluminescence device of claim 1, wherein the emission layer is to emit delayed fluorescence.

3. The organic electroluminescence device of claim 1, wherein the emission layer is a delayed fluorescence emission layer comprising a first compound and a second compound, and
the first compound comprises the polycyclic compound.

4. The organic electroluminescence device of claim 1, wherein the emission layer is a thermally activated delayed fluorescence emission layer to emit blue light.

5. The organic electroluminescence device of claim 1, wherein Ar is represented by Formula 2:

Formula 2

$$*\!\!-\!\!\phenyl\!\!-\!\!(Ra)_b$$

and
wherein in Formula 2,
Ra is a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or is combined with an adjacent group to form a ring, and
"b" is an integer of 0 to 5.

6. The organic electroluminescence device of claim 1, wherein Formula 1 is represented by Formula 3:

Formula 3

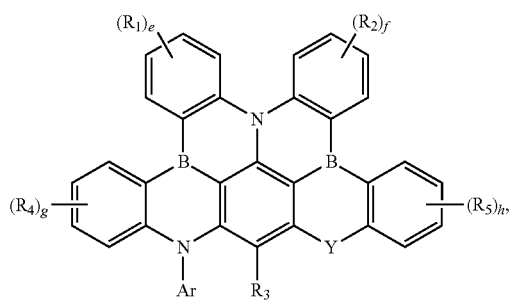

and wherein in Formula 3, $R_1$ to $R_5$ are each independently a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or are combined with an adjacent group to form a ring, "e" to "h" are each independently an integer of 0 to 4, and Y and Ar are the same as defined in Formula 1.

7. The organic electroluminescence device of claim 6, wherein $R_1$ to $R_5$ are each independently a hydrogen atom, a deuterium atom, a substituted or unsubstituted arylamine group, a substituted or unsubstituted phenyl group, a substituted or unsubstituted carbazole group, a substituted or unsubstituted dibenzofuran group, or a substituted or unsubstituted dibenzothiophene group.

8. The organic electroluminescence device of claim 1, further comprising a capping layer on the second electrode, the capping layer having a refractive index of about 1.6 or more.

9. The organic electroluminescence device of claim 6, wherein at least one of $R_1$ to $R_5$ comprises a substituted or unsubstituted amine group or a substituted or unsubstituted N-containing heteroaryl group.

10. The organic electroluminescence device of claim 6, wherein Formula 3 is represented by Formula 4-1 or Formula 4-2:

Formula 4-1

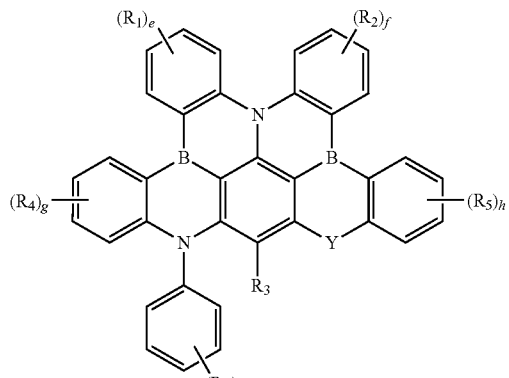

Formula 4-2

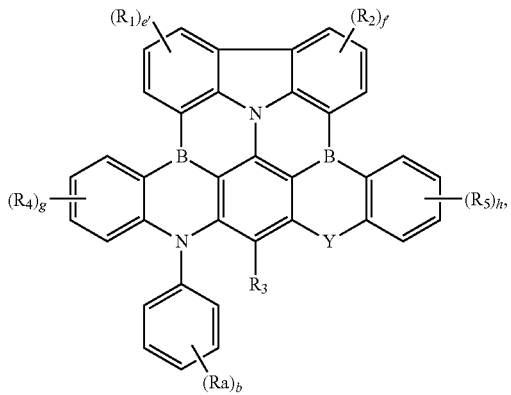

and wherein in Formula 4-1 and Formula 4-2,

Ra is a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or is combined with an adjacent group to form a ring, "b" is an integer of 0 to 5, "e" and "f" are each independently an integer of 0 to 3, and Y, $R_1$ to $R_5$, and "e" to "h" are the same as defined in Formula 3.

11. The organic electroluminescence device of claim 10, wherein Formula 4-1 is represented by Formula 5-1 or Formula 5-2:

Formula 5-1

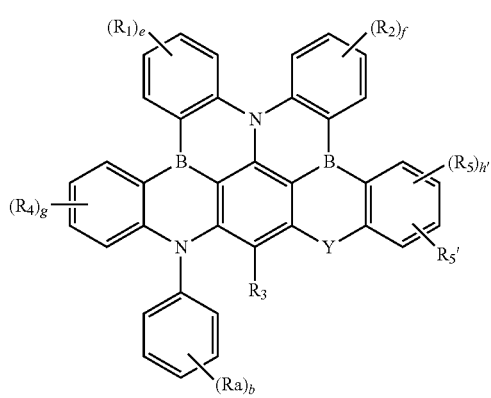

Formula 5-2

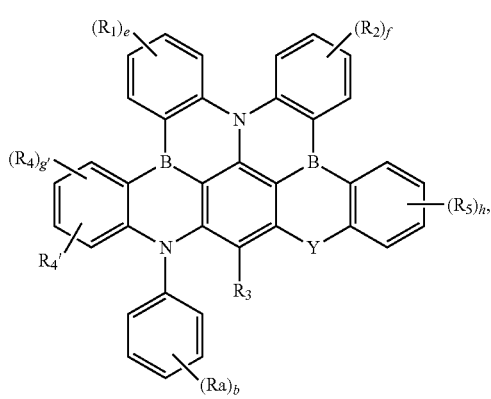

and
wherein in Formula 5-1 and Formula 5-2,
R$_4$' and R$_5$' are each independently a hydrogen atom, a deuterium atom, a substituted or unsubstituted arylamine group, a substituted or unsubstituted phenyl group, a substituted or unsubstituted carbazole group, a substituted or unsubstituted dibenzofuran group, or a substituted or unsubstituted dibenzothiophene group,
"g" and "h" are each independently an integer of 0 to 3, and
Y, R$_1$ to R$_5$, Ra, "b", and "e" to "h" are the same as defined in Formula 4-1.

12. The organic electroluminescence device of claim 1, wherein the compound represented by Formula 1 is at least one among compounds represented in Compound Group 1:

Compound Group 1

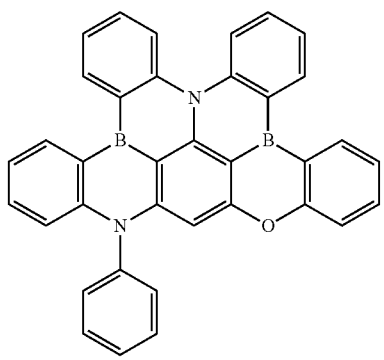
1

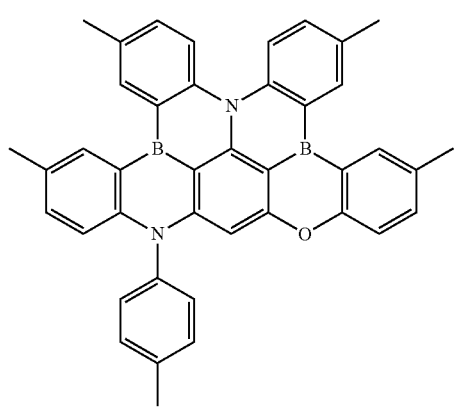
2

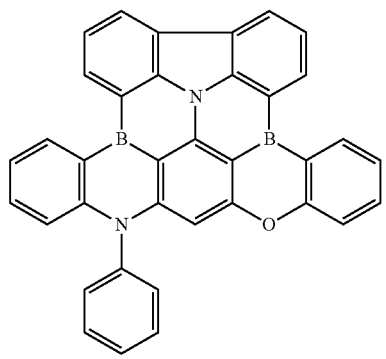
3

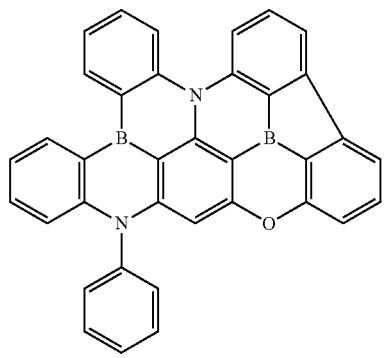
4

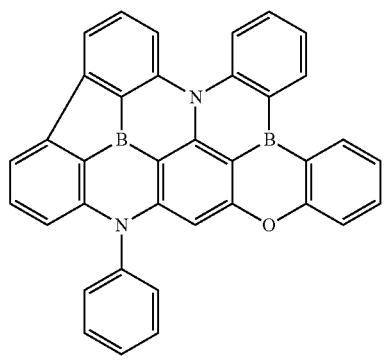
5

6
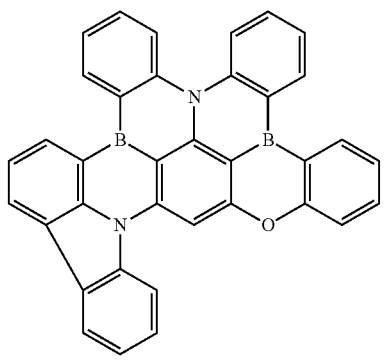
7
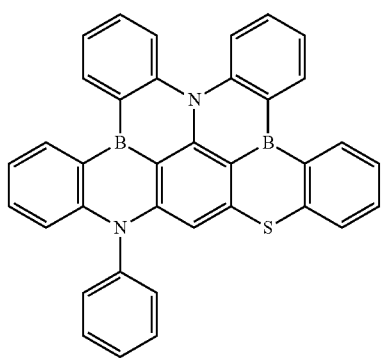
8
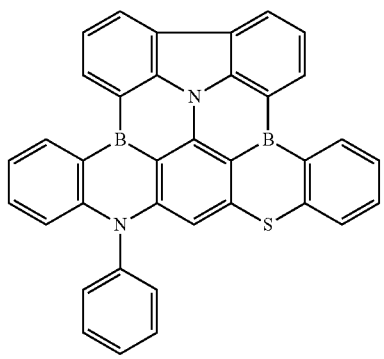
9
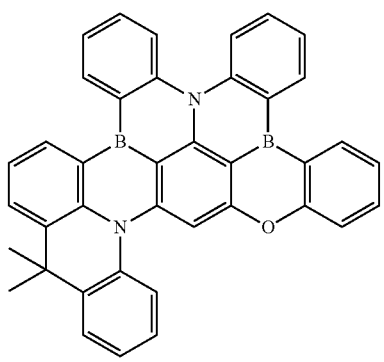
10
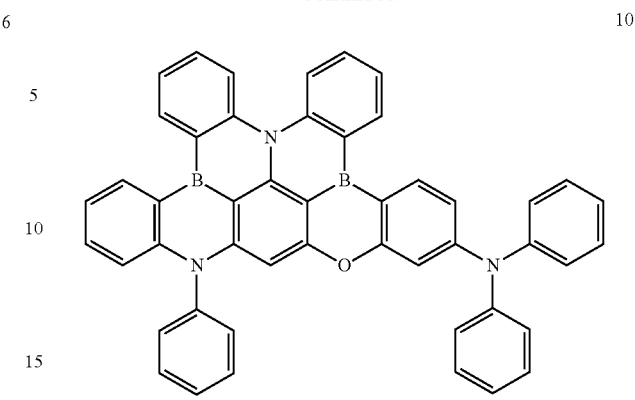
11
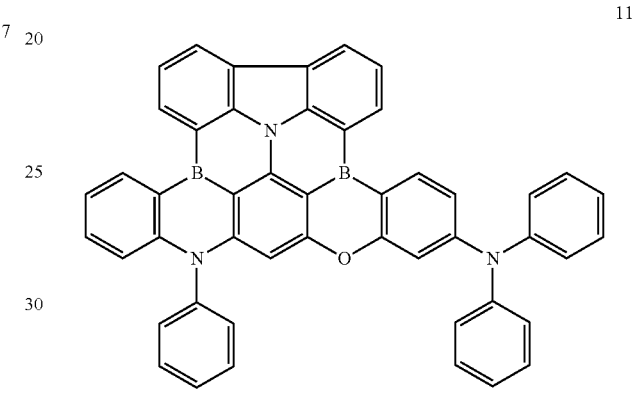
12
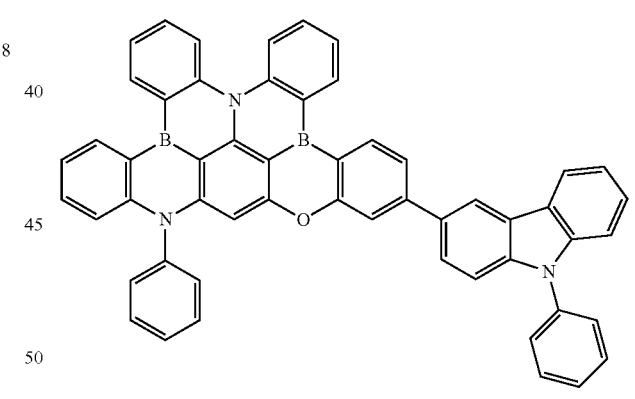
13
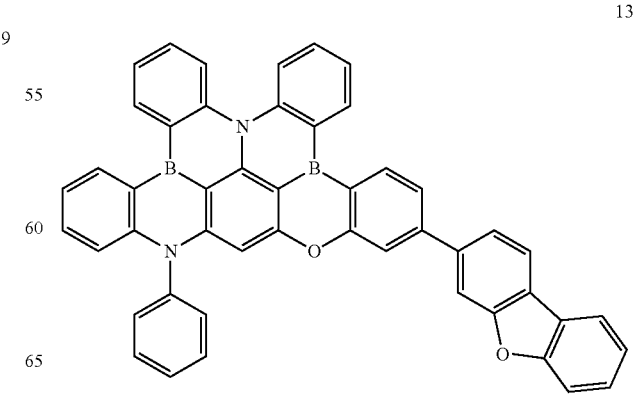

14
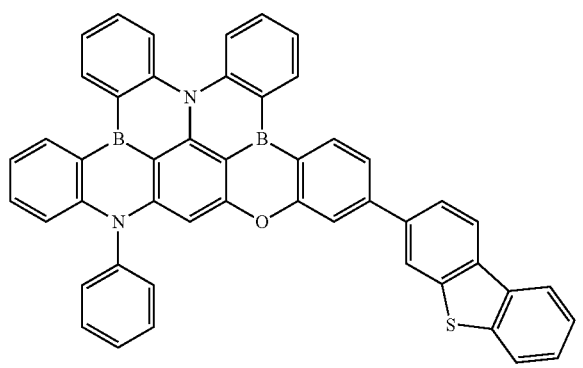
15
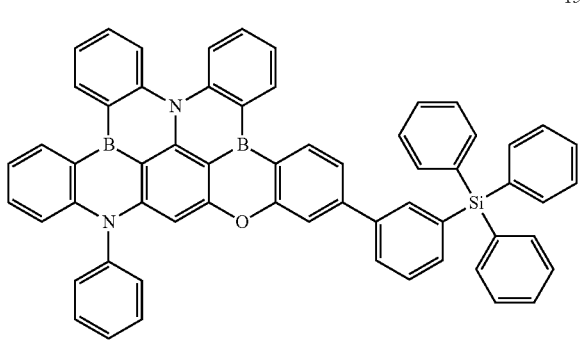
16
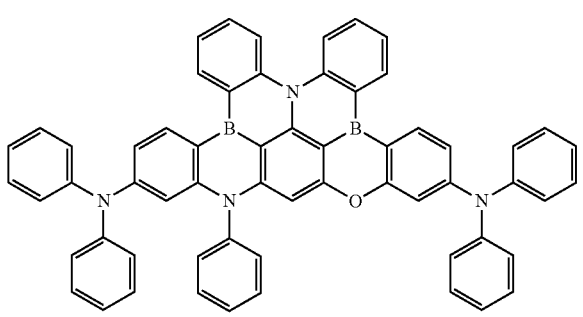
17
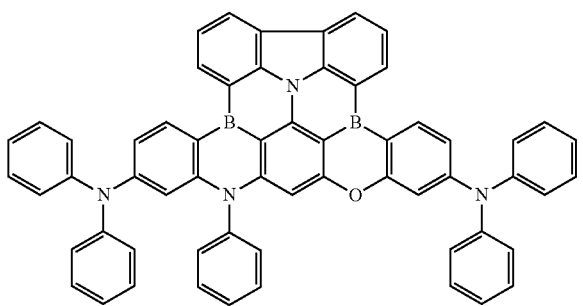
18
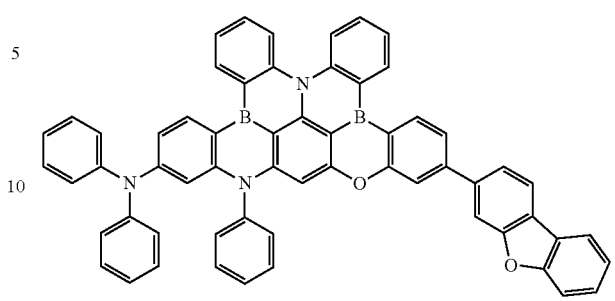
19
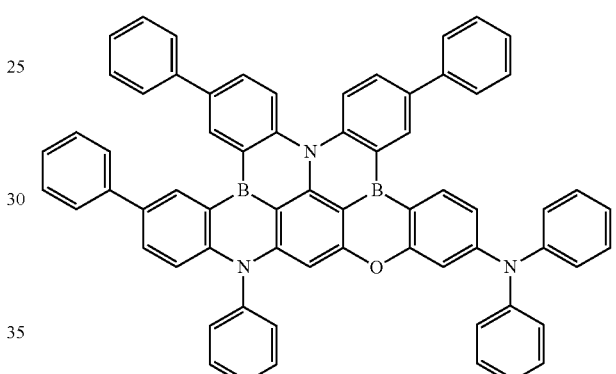
20
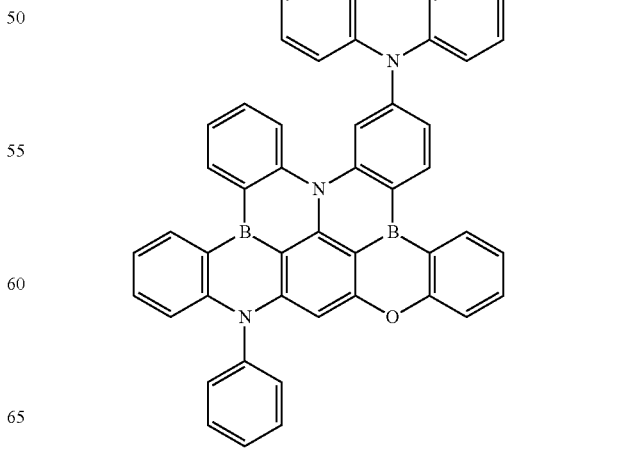

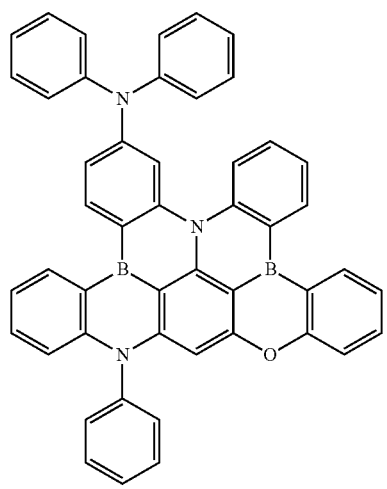
21
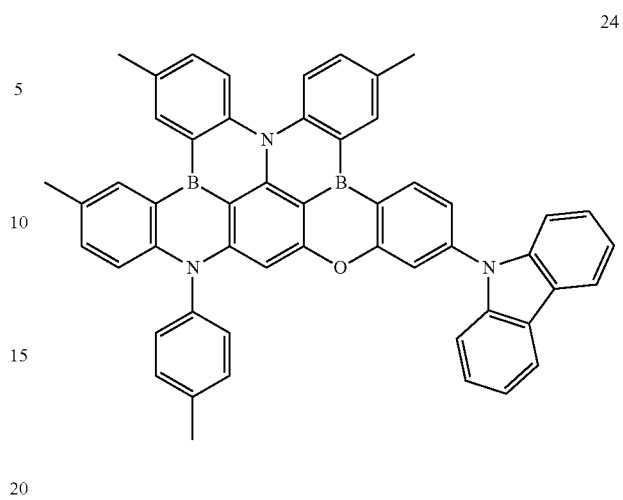
24
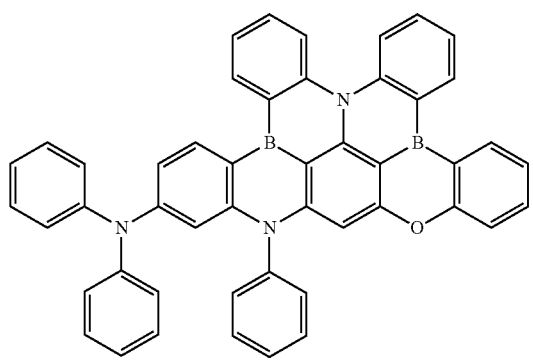
22
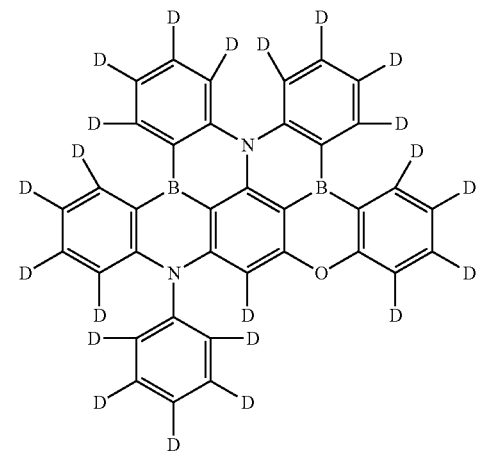
25
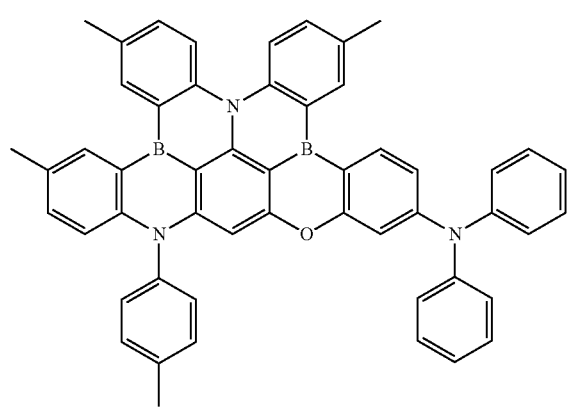
23
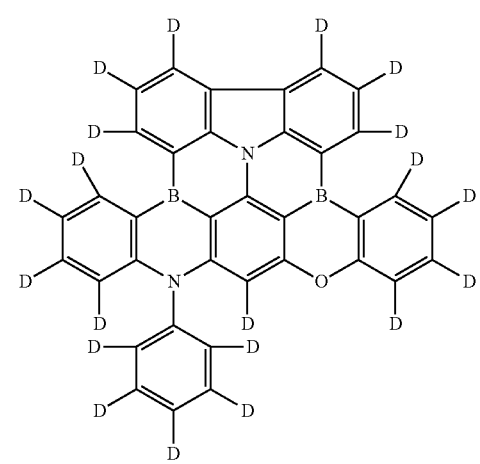
26

-continued

27

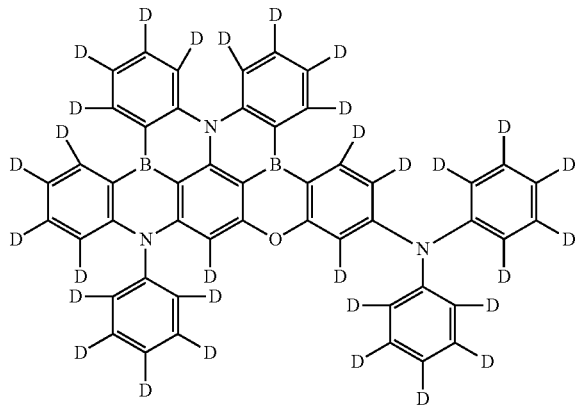

28

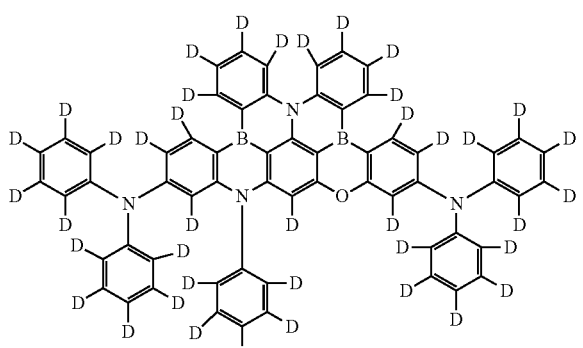

29

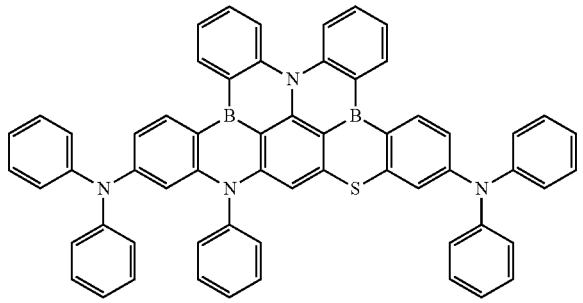

30

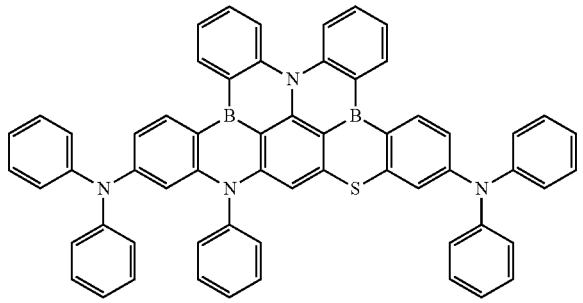

13. A polycyclic compound represented by Formula 1:

Formula 1

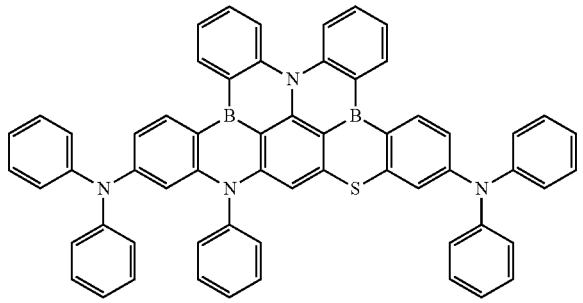

wherein in Formula 1,
Y is O or S,
ring D to ring H are each independently a substituted or unsubstituted aryl ring of 6 to 30 carbon atoms for forming a ring, or a substituted or unsubstituted heteroaryl ring of 2 to 30 carbon atoms for forming a ring, and/or ring E and ring F, ring F and ring H, ring G and ring E, ring G and Ar, and ring D and Ar are each independently combined with each other to form a ring, and
Ar is a substituted or unsubstituted aryl group of 6 to 30 carbon atoms for forming a ring or a substituted or unsubstituted heteroaryl group of 2 to 30 carbon atoms for forming a ring.

14. The polycyclic compound of claim 13, wherein Ar is represented by Formula 2:

Formula 2

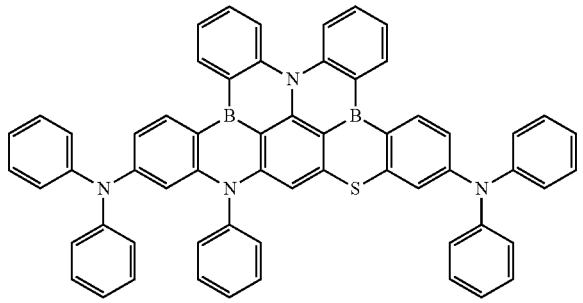

and
wherein in Formula 2,
Ra is a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or is combined with an adjacent group to form a ring, and
"b" is an integer of 0 to 5.

15. The polycyclic compound of claim 13, wherein Formula 1 is represented by Formula 3:

Formula 3

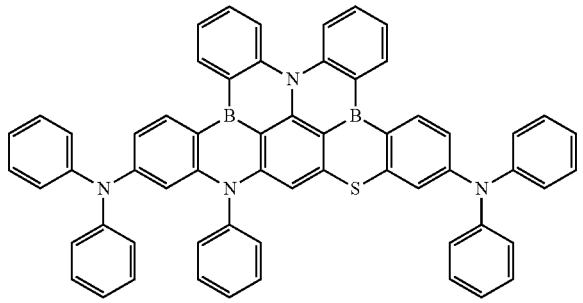

and
wherein in Formula 3,
R$_1$ to R$_5$ are each independently a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or are combined with an adjacent group to form a ring,
"e" to "h" are each independently an integer of 0 to 4, and
Y and Ar are the same as defined in Formula 1.

16. The polycyclic compound of claim 15, wherein R$_1$ to R$_5$ are each independently a hydrogen atom, a deuterium atom, a substituted or unsubstituted arylamine group, a substituted or unsubstituted phenyl group, a substituted or unsubstituted carbazole group, a substituted or unsubstituted dibenzofuran group, or a substituted or unsubstituted dibenzothiophene group.

17. The polycyclic compound of claim 15, wherein at least one of R$_1$ to R$_5$ comprises a substituted or unsubstituted amine group or a substituted or unsubstituted N-containing heteroaryl group.

18. The polycyclic compound of claim 15, wherein Formula 3 is represented by Formula 4-1 or Formula 4-2:

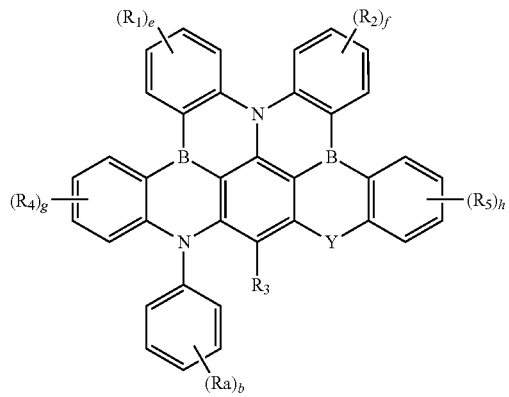

Formula 4-1

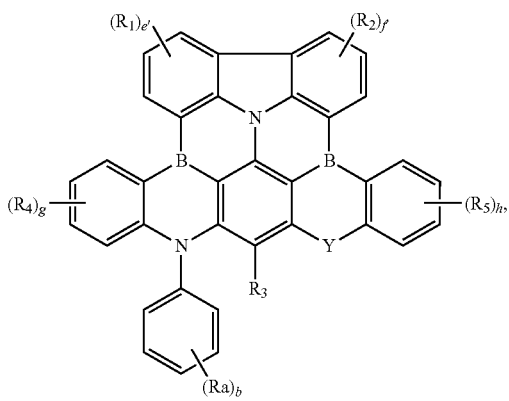

Formula 4-2 and
wherein in Formula 4-1 and Formula 4-2,
Ra is a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or is combined with an adjacent group to form a ring,
"b" is an integer of 0 to 5,
"e" and "f" are each independently an integer of 0 to 3, and
Y R$_1$ to R$_5$, and "e" to "h" are the same as defined in Formula 3.

19. The polycyclic compound of claim 18, wherein Formula 4-1 is represented by Formula 5-1 or Formula 5-2:

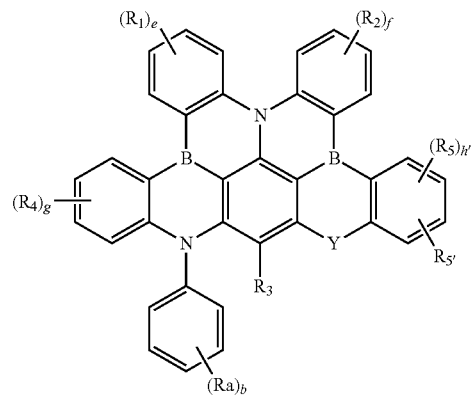

Formula 5-1

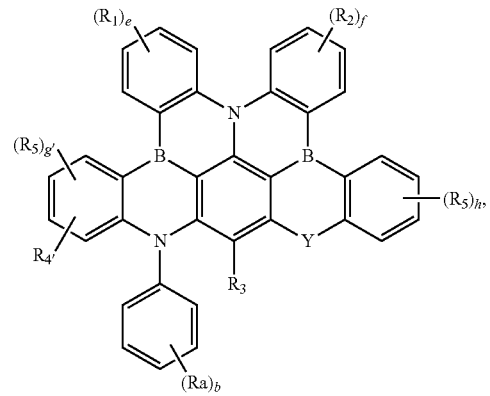

Formula 5-2 and
wherein in Formula 5-1 and Formula 5-2,
R$_4$' and R$_5$' are each independently a hydrogen atom, a deuterium atom, a substituted or unsubstituted arylamine group, a substituted or unsubstituted phenyl group, a substituted or unsubstituted carbazole group, a substituted or unsubstituted dibenzofuran group, or a substituted or unsubstituted dibenzothiophene group,
"g" and "h" are each independently an integer of 0 to 3, and
Y, R$_1$ to R$_5$, Ra, "b" and "e" to "h" are the same as defined in Formula 4-1.

20. The polycyclic compound of claim 13, wherein the compound represented by Formula 1 is at least one among compounds represented in Compound Group 1:

Compound Group 1
1
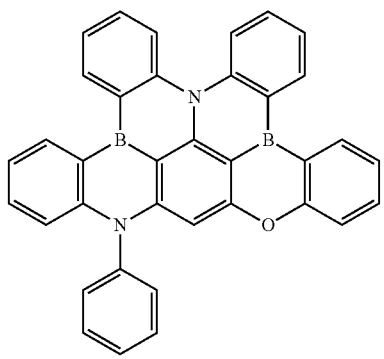
2
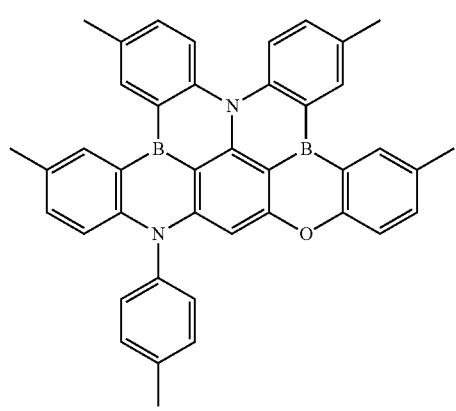
3
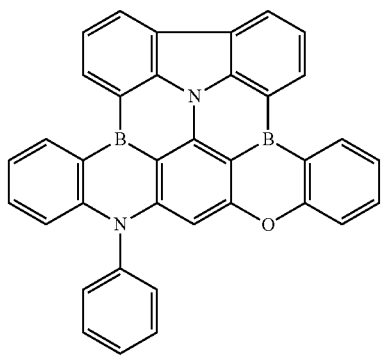
4
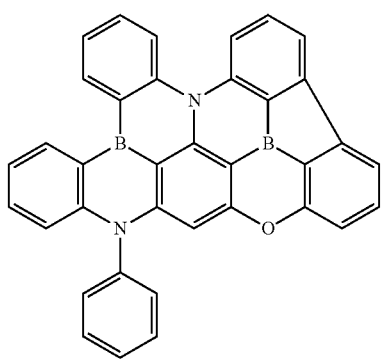
5
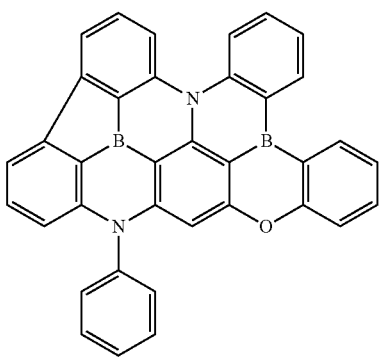
6
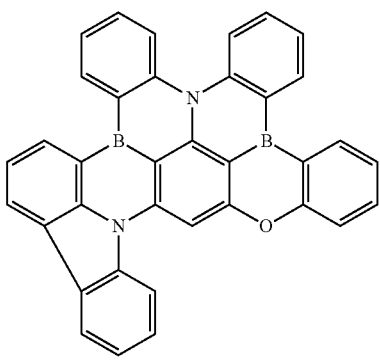
7
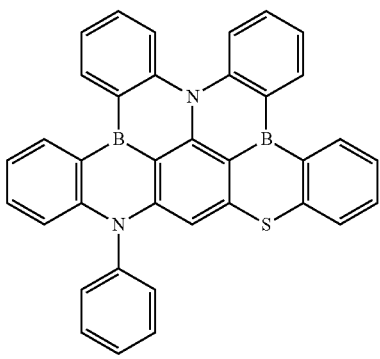
8
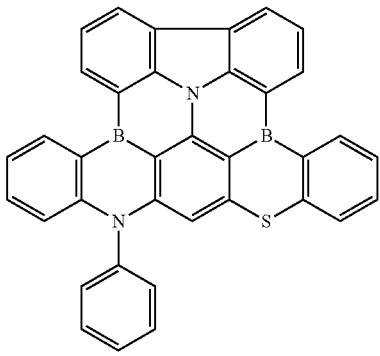

-continued
9
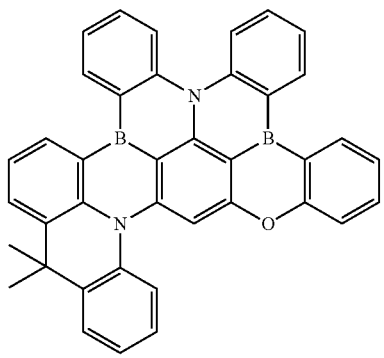
5
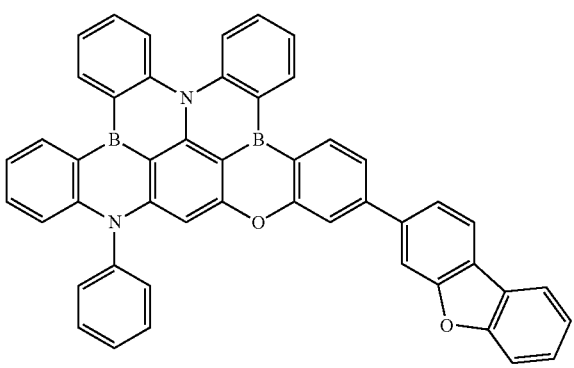
10
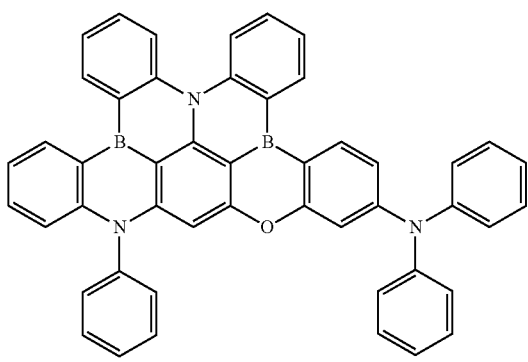
11
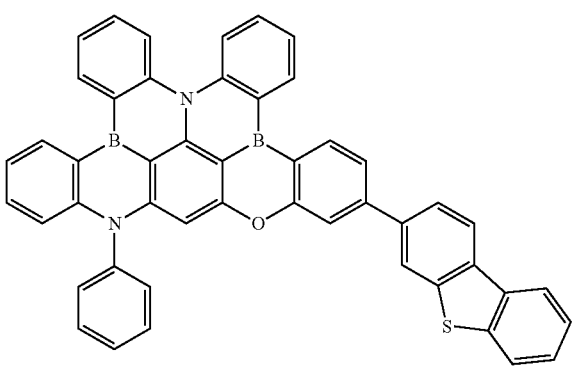
12
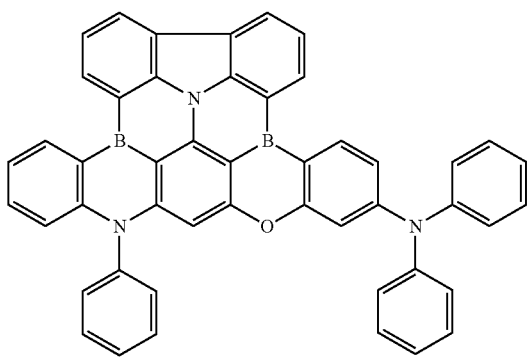
13
14
15
16
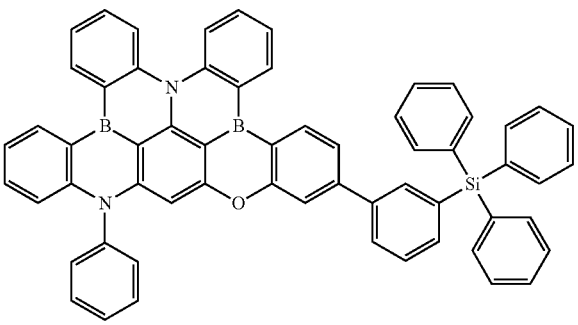
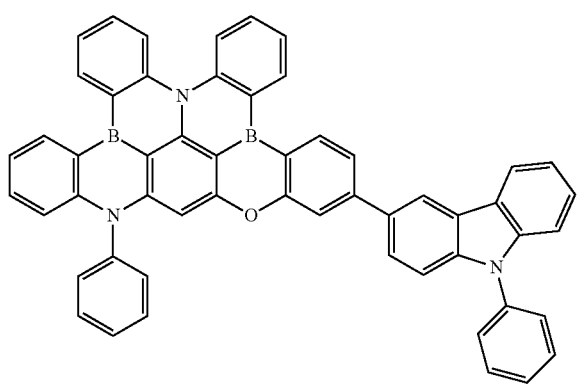
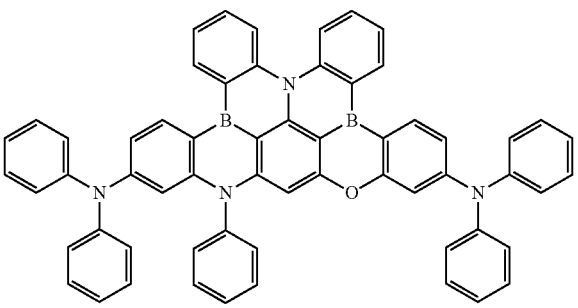

17
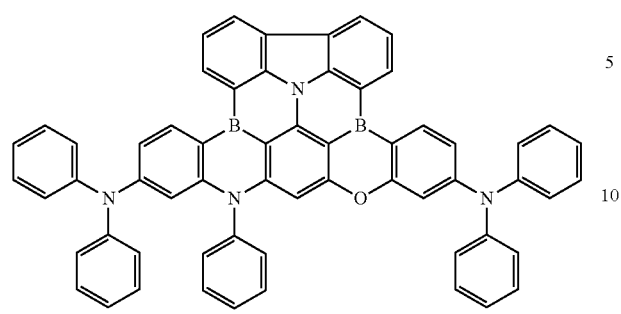
18
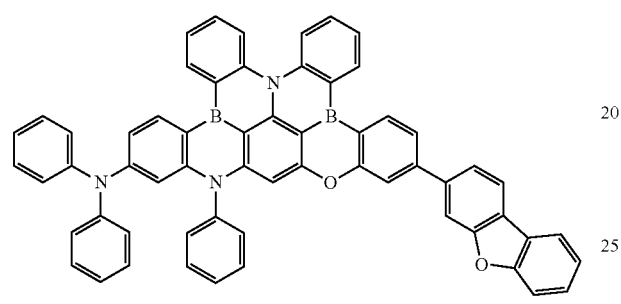
19
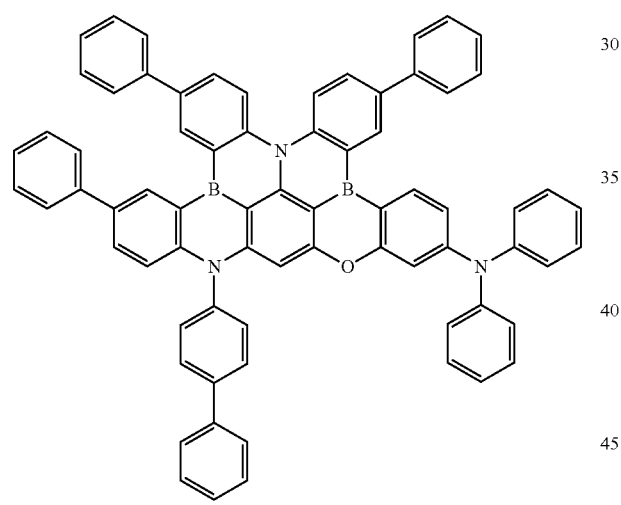
20
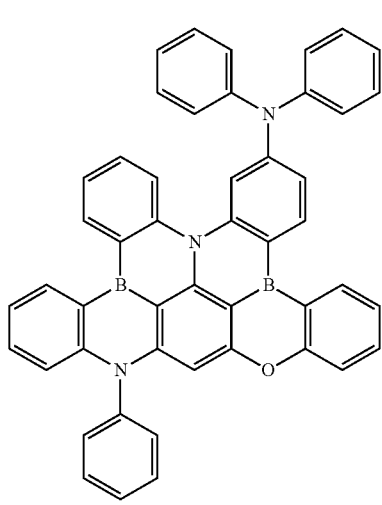
21
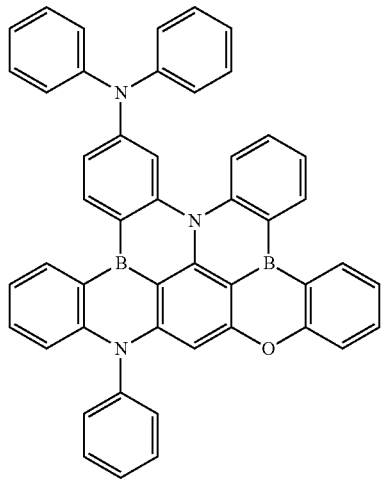
22
23

24
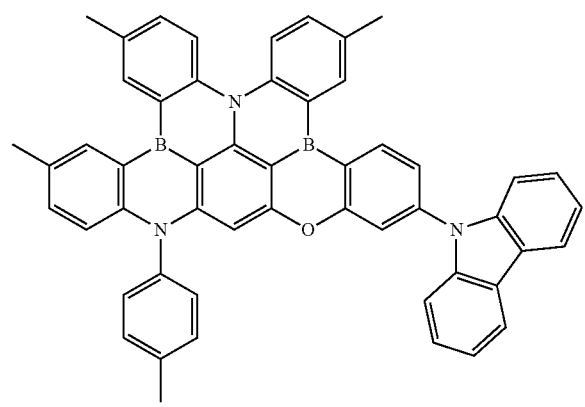
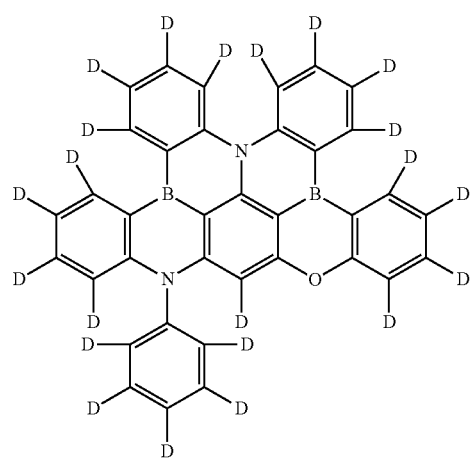
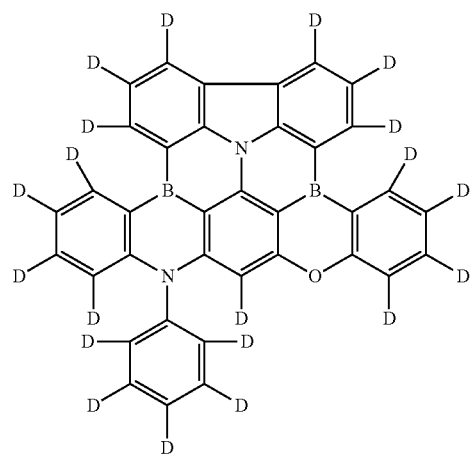
27
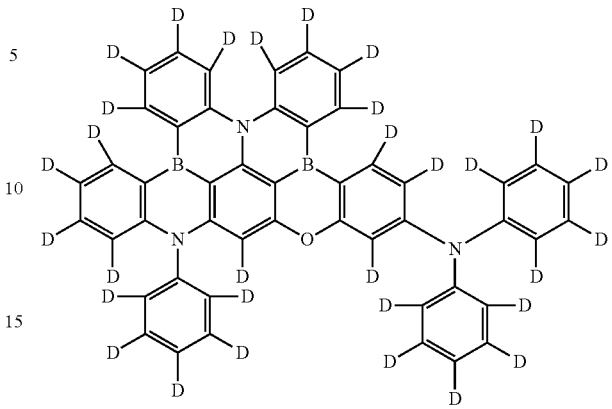
28
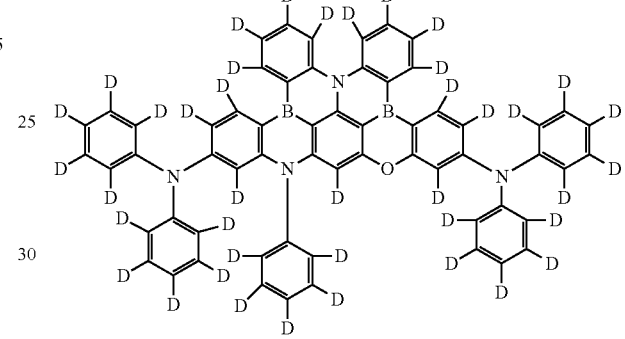
29
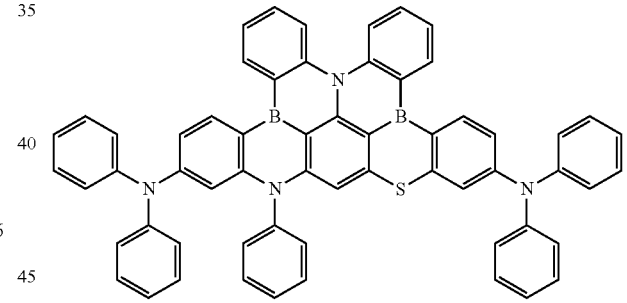
30
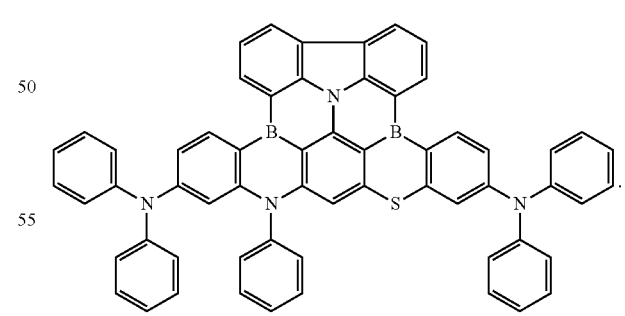
* * * * *